United States Patent
Chen et al.

(10) Patent No.: US 11,289,463 B2
(45) Date of Patent: Mar. 29, 2022

(54) DISPLAY PANEL

(71) Applicant: PlayNitride Inc., Hsinchu County (TW)

(72) Inventors: Pei-Hsin Chen, Hsinchu County (TW);
Yi-Ching Chen, Hsinchu County (TW);
Yi-Chun Shih, Hsinchu County (TW);
Yu-Chu Li, Hsinchu County (TW);
Ying-Tsang Liu, Hsinchu County (TW); Chih-Chiang Lu, Hsinchu County (TW); Gwo-Jiun Sheu, Hsinchu County (TW); Po-Jen Su, Hsinchu County (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 17/001,632

(22) Filed: Aug. 24, 2020

(65) Prior Publication Data

US 2020/0388599 A1 Dec. 10, 2020

Related U.S. Application Data

(63) Continuation-in-part of application No. 16/515,267, filed on Jul. 18, 2019, now Pat. No. 10,790,331.

(30) Foreign Application Priority Data

Jul. 20, 2018 (TW) .................... 107125105

(51) Int. Cl.
*H01L 25/13* (2006.01)
*H01L 33/58* (2010.01)

(52) U.S. Cl.
CPC .............. *H01L 25/13* (2013.01); *H01L 33/58* (2013.01)

(58) Field of Classification Search
CPC ..... H01L 25/13; H01L 33/58; H01L 25/0753; H01L 27/156; H01L 33/62
See application file for complete search history.

(56) References Cited

U.S. PATENT DOCUMENTS

| 9,858,847 | B2* | 1/2018 | Matsueda | ............ G09G 3/2003 |
| 10,985,223 | B2* | 4/2021 | Bok | .................... H01L 27/3246 |
| 2009/0322215 | A1* | 12/2009 | Sung | .................... H01L 27/3211 313/504 |
| 2016/0155755 | A1* | 6/2016 | Liu | .................... H01L 29/78633 257/72 |
| 2017/0207281 | A1* | 7/2017 | Hack | .................... H01L 27/322 |
| 2017/0250377 | A1* | 8/2017 | Tokuda | .................. H01L 27/322 |
| 2019/0013298 | A1* | 1/2019 | Lai | .......................... H01L 33/62 |
| 2019/0280055 | A1* | 9/2019 | Hack | ................... H01L 27/3213 |
| 2019/0296093 | A1* | 9/2019 | Liu | ..................... H01L 27/3218 |
| 2019/0378873 | A1* | 12/2019 | Lee | ......................... H01L 33/50 |
| 2020/0176530 | A1* | 6/2020 | Baek | .................... H01L 27/156 |

* cited by examiner

*Primary Examiner* — Victor A Mandala
(74) *Attorney, Agent, or Firm* — JCIPRNET

(57) ABSTRACT

A display panel includes a first substrate, a plurality of first color micro light emitting diodes (LEDs), a plurality of second color LEDs and a shading layer. The first substrate has a plurality of pixel zones arranged in an array form. Each of the first color LEDs has a first light emitting surface facing to a display direction. Each of the second color LEDs has a second light emitting surface facing to the display direction. Each of the pixel zones is provided with one of the first color micro LEDs and one of the second color LEDs. The shading layer is disposed in the pixel zones. The shading layer overlaps part of the first light emitting surface and part of the second light emitting surface in the display direction.

24 Claims, 18 Drawing Sheets

DISPLAY PANEL

CROSS-REFERENCE TO RELATED APPLICATION

This application is a continuation-in-part application of and claims the priority benefit of U.S. application Ser. No. 16/515,267, filed on Jul. 18, 2019, now allowed, which claims the priority benefit of Taiwan application serial no. 107125105, filed on Jul. 20, 2018. The entirety of each of the above-mentioned patent applications is hereby incorporated by reference herein and made a part of this specification.

BACKGROUND

Technical Field

This disclosure relates to a display panel, and more particularly to a display panel with micro light-emitting diodes.

Description of Related Art

In the structure of current display panels, a plurality of pixels is disposed in the display area, and a plurality of sub-pixels are disposed in each pixel. Each sub-pixel can emit lights in different colors. In general, sub-pixels are configured to emit red, green, and blue lights respectively. Each sub-pixel can be separately driven to emit said lights of a predetermined intensity. Under an appropriate pixel size ratio, the colorful lights of the pixels will be mixed into one color in the human visual perception. As a result, the display panel can provide a vivid display image to the viewer.

However, in practice, because of the limitation of materials or manufacture processes, sub-pixels with different colors may have different luminous efficiencies and thus affect the light-mixing effects provided by the pixels. Currently, the luminous efficiency is usually compensated by adjusting the voltage or current. On the other hand, lights emitted by different pixels should be independent to each other, without interfering with each other in an ideal situation. However, actually, the light emitted by each pixel has no specific directionality but diverges in all directions, so adjacent pixels easily affect each other. Therefore, there is a need for a panel architecture to overcome such problems.

SUMMARY

The present disclosure provides a display panel to overcome the problems caused by the different luminous efficiencies and the different sizes of the different colored LEDs.

According to one or more embodiments of this disclosure, a Micro LED display panel is disclosed in this present disclosure. The Micro LED display panel comprises a first substrate and a shading layer. The first substrate has a plurality of pixel zones arranged in an array form. Each of the pixel zones comprises a first color LED and a second color LED. The first color LED comprises a first light-emitting surface facing to a display direction, the second color LED comprises a second light-emitting surface facing to the display direction, and an area of the first light-emitting surface is larger than an area of the second light-emitting surface. The shading layer is disposed in the pixel zones, and the shading layer covers part of the first light-emitting surfaces.

A display panel includes a first substrate, a plurality of first color micro light emitting diodes (LEDs), a plurality of second color LEDs and a shading layer. The first substrate has a plurality of pixel zones arranged in an array form. Each of the first color LEDs has a first light emitting surface facing to a display direction. Each of the second color LEDs has a second light emitting surface facing to the display direction. Each of the pixel zones is provided with one of the first color micro LEDs and one of the second color LEDs. The shading layer is disposed in the pixel zones. The shading layer overlaps part of the first light emitting surface and part of the second light emitting surface in the display direction.

In an embodiment of the disclosure, an area of the first light emitting surface is larger than an area of the second light emitting surface.

In an embodiment of the disclosure, a wavelength of the first color LEDs is greater than a wavelength of the second color LEDs.

In an embodiment of the disclosure, an area of the first light emitting surface exposed by the shading layer is the same as an area of the second light emitting surface exposed by the shading layer.

In an embodiment of the disclosure, the display panel further includes a plurality of third color LEDs. Each of the third color LEDs has a third light emitting surface facing to the display direction, wherein each of the pixel zones is provided with one of the first color micro LEDs, one of the second color LEDs and one of the third color LEDs, and the shading layer overlaps part of the third light emitting surface in the display direction.

In an embodiment of the disclosure, an area of the third light emitting surface exposed by the shading layer is the same as an area of the first light emitting surface exposed by the shading layer. Alternatively, an area of the third light emitting surface exposed by the shading layer is the same as an area of the second light emitting surface exposed by the shading layer.

In an embodiment of the disclosure, an area of the first light emitting surface exposed by the shading layer, an area of the second light emitting surface exposed by the shading layer and an area of the third light emitting surface exposed by the shading layer are the same.

In an embodiment of the disclosure, an area of the first light emitting surface is larger than an area of the second light emitting surface. The area of the second light emitting surface is larger than or equal than an area of the third light emitting surface.

In an embodiment of the disclosure, a wavelength of the first color LEDs is greater than a wavelength of the second color LEDs, and the wavelength of the second color LEDs is greater than a wavelength of the third color LEDs.

In an embodiment of the disclosure, an area of the first light emitting surface exposed by the shading layer is larger than an area of the second light emitting surface exposed by the shading layer.

In an embodiment of the disclosure, a wavelength of the first color LEDs is greater than a wavelength of the second color LEDs.

In an embodiment of the disclosure, an area of the first light emitting surface is the same as an area of the second light emitting surface.

In an embodiment of the disclosure, the shading layer includes a plurality of openings corresponding to the pixel zones. Each of the openings expose part of the first light emitting surface of each of the first color LEDs and the second light emitting surface of each of the second color LEDs.

In an embodiment of the disclosure, the light emitting surface of each of the first color LEDs is the same as the light emitting surface of each of the second color LEDs. A luminous efficiency of each of the first color LEDs is different from a luminous efficiency of each of the second color LEDs.

In an embodiment of the disclosure, the luminous efficiency of each of the first color LEDs is greater than the luminous efficiency of each of the second color LEDs.

In an embodiment of the disclosure, a light emitting area of each of the first color LEDs is different from a light emitting area of each of the second color LEDs.

In an embodiment of the disclosure, a wavelength of the plurality of first color LEDs is greater than a wavelength of the plurality of second color LEDs, and an area of the first light emitting surface exposed by the shading layer is larger than an area of the second light emitting surface exposed by the shading layer.

In an embodiment of the disclosure, a maximum width of the first light emitting surface and a maximum width of the second light emitting surface are respectively 10 micrometers to 150 micrometers.

In an embodiment of the disclosure, a maximum width of the first light emitting surface exposed by the shading layer and a maximum width of the second light emitting surface exposed by the shading layer are respectively less than 50 micrometers.

In an embodiment of the disclosure, a ratio of the shading layer in each of the pixel zones is larger than the first light emitting surface, the second light emitting surface or the third light emitting surface in each of the pixel zones.

In an embodiment of the disclosure, a ratio of the shading layer in each of the pixel zones is larger than the sum of the first light emitting surface, the second light emitting surface and the third light emitting surface in each of the pixel zones.

In an embodiment of the disclosure, a ratio of the shading layer in each of the pixel zones is greater than or equal to 50%.

In an embodiment of the disclosure, an arrangement direction of the first color LEDs is different from an arrangement direction of the second color LEDs.

In an embodiment of the disclosure, two adjacent pixel zones of the pixel zones share one of the first color LEDs.

In an embodiment of the disclosure, a distance between two adjacent first color LEDs is less than a distance between two adjacent second color LEDs.

To sum up, the display panel includes the shading layer which overlaps part of the first light emitting surface and part of the second light emitting surface in the display direction. Hence, the area of the light emitting surface of the first color LED and the area of the light emitting surface of the second color LED can be changed according to its luminous efficiency. Furthermore, by the shading layer, the interference between the color light beams emitted by two adjacent pixel zones can be suppressed.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
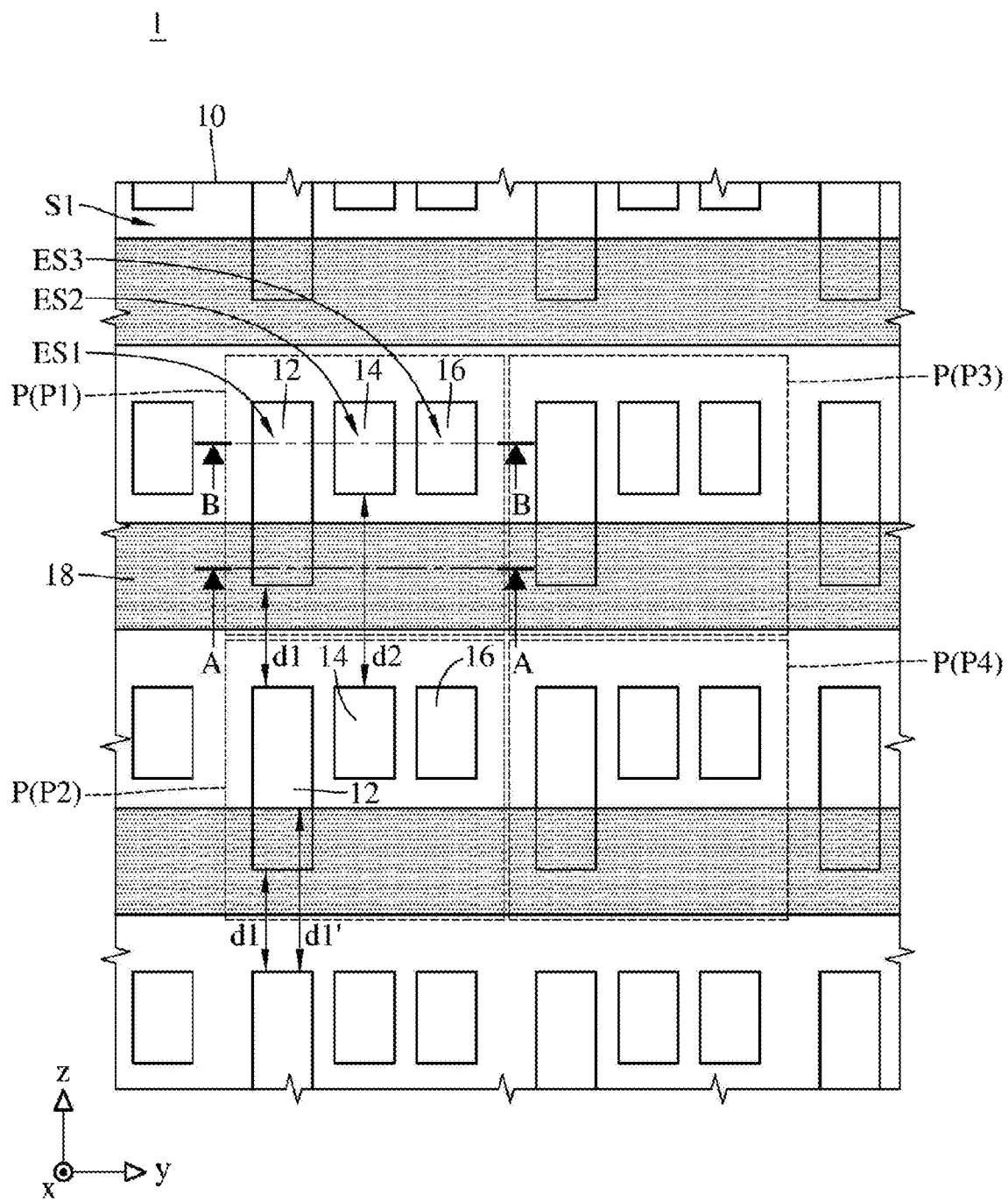
FIG. 1 is a structural schematic diagram of a display panel according to the first embodiment of the present disclosure.
Figure 2A:
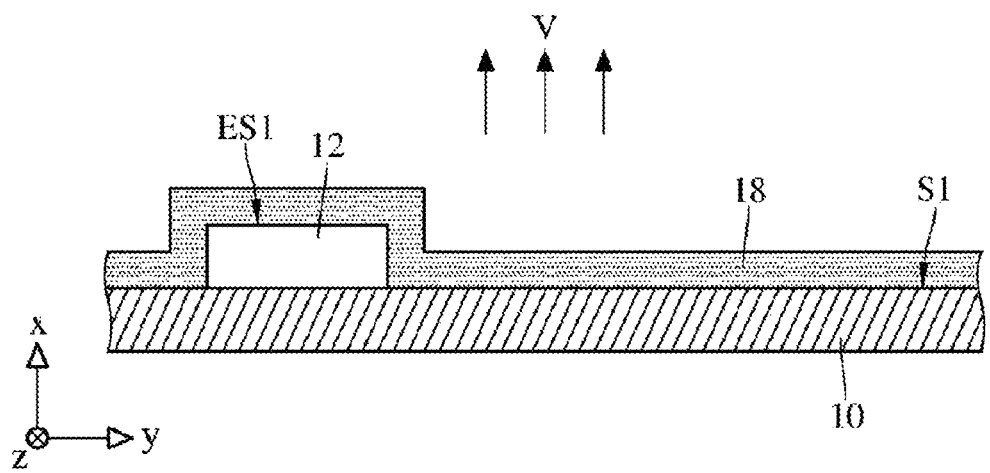
FIG. 2A is a schematic cross-sectional view showing an embodiment of a display panel according to the AA line of FIG. 1.
Figure 2B:
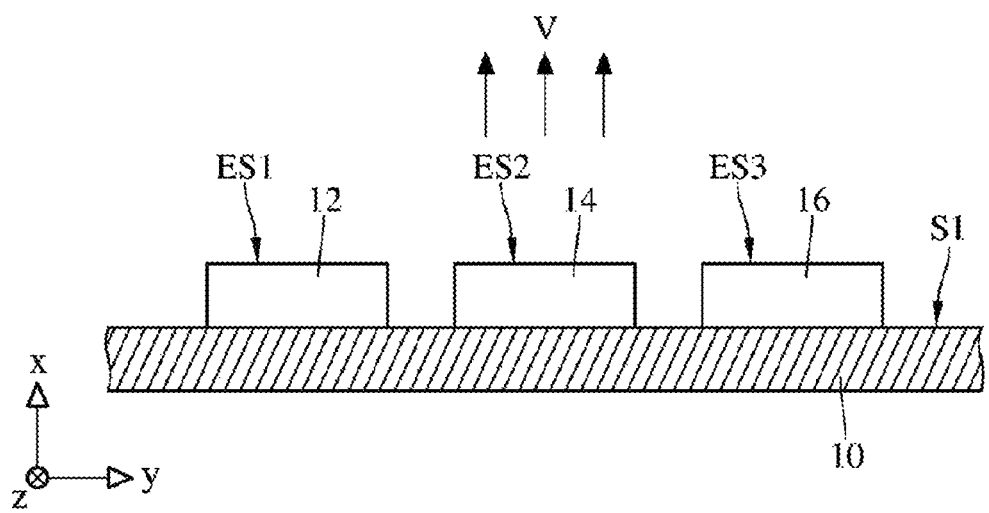
FIG. 2B is a schematic cross-sectional view showing an embodiment of a display panel according to the BB line of FIG. 1.

Please refer to FIG. 1, FIG. 2A and FIG. 2B. FIG. 1 is an overlook schematic diagram according to the display panel in the first embodiment, FIG. 2A is a cross-sectional schematic diagram according to the AA line of FIG. 1, and FIG. 2B is a cross-sectional schematic diagram according to the BB line of FIG. 1. A display panel comprises a first substrate 10, a plurality of first color LEDs 12, a plurality of second color LEDs 14, a plurality of third color LEDs 16 and a shading layer 18. The display panel has a display direction V. The display direction V is the direction that images show to the viewers. For example, the display direction V is in the positive x-axis and points away from the paper in FIG. 1, and the display direction V is in the positive x-axis direction and points up in FIG. 2A and FIG. 2B. The first substrate 10 includes a plurality of pixel zones P and a first surface S1, wherein the first surface S1 faces to the display direction V. Also, the shading layer 18 is disposed in the plurality of pixel zones P. The pixel zones P are arranged in an array form, and every pixel zone P comprises one of the first color LEDs 12, one of the second color LEDs 14, and one of the third color LEDs 16. The first color LED 12 comprises a first light-emitting surface ES1 facing to the display direction V, the second color LED 14 comprises a second light-emitting surface ES2 facing to the display direction V, and the third color LED 16 comprises a third light-emitting surface ES3 facing to the display direction V. Specifically, the first color LED 12, the second color LED 14, and the third color LED 16 are electrically connected to the first substrate 10 and disposed on the first surface S1.

The first color LED 12, the second color LED 14, and the third color LED 16 are Micro Light-emitting diode (Micro LED). The following examples are shown in case that the first color LED 12 emits red light, the second color LED 14 emits blue light, and the third color LED 16 emits green light. In practice, the luminous efficiency of the first color LED 12, the second color LED 14 and the third color LED 16 will be effected by their sizes, especially the first color LED 12 which emits red light. When the first color LED 12 is made in miniature size (for example, implemented by micro LED, length of micro LED is smaller than 150 um, thickness of micro LED is smaller than 15 um), the luminous efficiency of the first color LED 12 decreases obviously. Even though calibrating the current and the voltage by systems or software for compensation may be provided to increase the electrical power consumption, it is still hard to make the first color LED 12 emits red light with enough luminance. Hence, to improve the luminous efficiency, the size of the first color LED 12 is larger than the size of the second color LED 14 or the third color LED 16 in the first embodiment. Therefore, an area of the first light-emitting surface ES1 is larger than an area of the second light-emitting surface ES2 or an area of the third light-emitting surface ES3. For a preferable example, the length of diagonal lines of the first light-emitting surface ES1 are from 100 to 500 µm, or the area of the first light-emitting surface ES1 is larger than the area of the second light-emitting surface ES2 and the third light-emitting surface ES3 for 2 to 20 times. Hence, the luminous efficiency of the first color LED 12 can be kept in an ideal range.

For the two adjacent pixel zones P (for example, pixel zones P1 and P2) on the first substrate 10, since the size of the first color LED 12 is larger than either the size of the second color LED 14 or the size of the third color LED 16, based on positions of the pixel zone P1, the pixel zone P2 and the all the LEDs disposed in the pixel zones P1 and P2, the distance between the first color LED 12 in the pixel zone P1 and another first color LED 12 in the pixel zone P2 is shorter than the distance between the second color LED 14 in the pixel zone P1 and another second color LED 14 in the pixel zone P2 or the distance between the third color LED 16 in the pixel zone P1 and another third color LED 16 in the pixel zone P2. In other words, the distance d1 between the two first color LEDs 12 disposed in the pixel zones P1 and P2 is less than the distance d2 between the two second color LEDs 14 disposed in the pixel zones P1 and P2. In summary based on the above description, the distance between the first color LED 12 and an adjacent first color LED 12 is less than the distance between the second color LED 14 and an adjacent second color LED 14.

However, for human's visual perception, an unexpected equivalent pixel is formed by the first color LED 12 disposed in the pixel zone P1 and the second color LED 14 or the third color LED 16 disposed in the pixel zone P2; therefore, it effects viewer's visual perception and makes blurry display images. In another condition, part of the light emitted by the first color LED 12 in the pixel zone P1 interferes the light emitted by the LEDs disposed in the pixel zone P2. Particularly, the light emitted by the LEDs disposed in the pixel zone P2 gains the component of the red light emitted from the pixel zone P1, and making the color shift. Hence, in this embodiment, the shading layer 18 covers part of the first light-emitting surface ES1 in the display direction V to avoid different pixels interfering each other. In addition, the display direction V is the same as the light-emitting direction of the first light-emitting surface ES1 as the previous definition.

Although the light emitted by the first color LED 12 is shielded by the shading layer 18 and making the External Quantum Efficiency (EQE) lower, the Internal Quantum Efficiency (IQE) of the first color LED 12 is increased, the total luminance of the first color LED 12 can be improved still.

The further description of the shade layer 18 is based on FIG. 2A and FIG. 2B. FIG. 2A shows the part of the first color LED 12 overlapped by the shade layer 18 in the pixel zones P, and FIG. 2B shows the cross-section of the LEDs which are uncovered by the shading layer 18 disposed in the pixel zones P. In this embodiment, the display direction V is in the positive x-axis, and the shading layer 18 is disposed on the first color LED 12 and the first substrate 10.

Commonly, the first substrate 10 comprises a circuit construction. For example, a semi-conductor or a conducting wire, which electrically connects to and operates the LEDs to emit light. Since this is not a key feature in the present disclosure, there is no further description and drawing to show it.

In this embodiment, the shape of the shading layer 18 is designed as a strip and overlaps part of the first light-emitting surface ES1 (shown in FIG. 1), and another part of the first light-emitting surface ES1 is uncovered by the shading layer 18. In an embodiment, the size of the first light-emitting surface ES1 is from 50 µm to 500 µm. There is a distance d1 between the first color LED 12 and another first color LED 12 disposed in the next pixel zone (for example, sub-pixel zone P2). However, the shading layer 18 covers a part of the first color LED 12 in each pixel zone P, there is an increased distance d1' between the effective light emitting area of the first color LEDs 12 in the different sub-pixel zones (for example, those in the sub-pixel zone P1 and sub-pixel zone P2). In other words, even though the first color LED 12 has a large size, the interference problem can be solved by the overlaps provided by the shading layer 18.

As FIG. 1 shows, the shading layer 18 extends in the positive y-axis direction and overlaps the first light-emitting surface ES1 of the first color LED 12 which is in the pixel zones P1 and P3. However, in practice, the shape of the shade layer 18 also can be designed as in an island shape and partially disposed on the first light-emitting surface ES1 of the first color LED 12. People who have ordinary skill in this technical field can design the shape, thickness and material of the shading layer 18 for different applications, so they are not limited in this case.

Figure 3A:
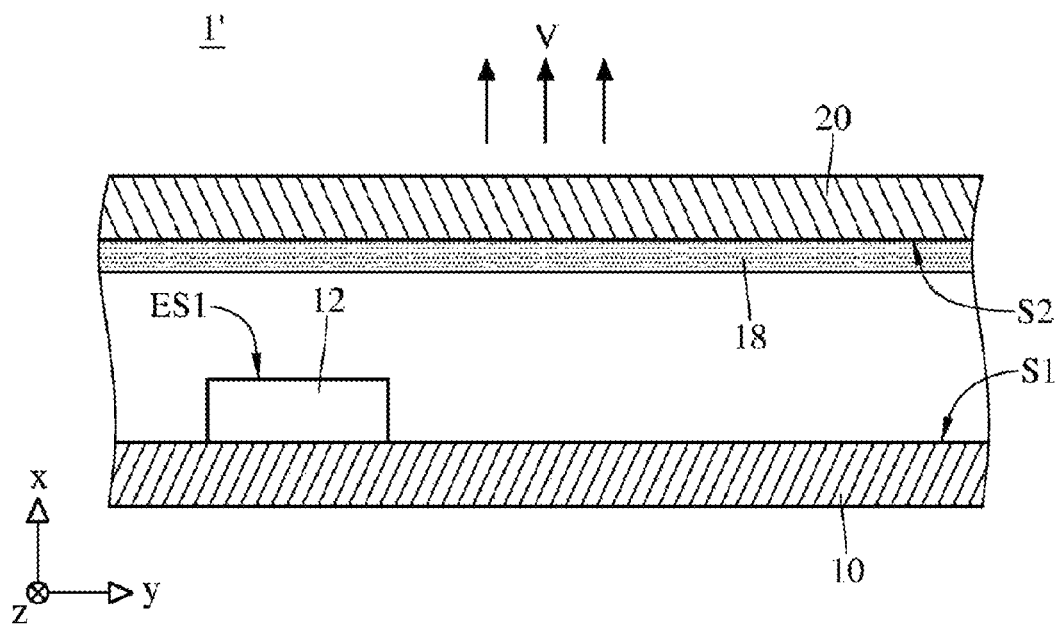
FIG. 3A is a schematic cross-sectional view showing another embodiment of a display panel according to the AA line of FIG. 1.
Figure 3B:
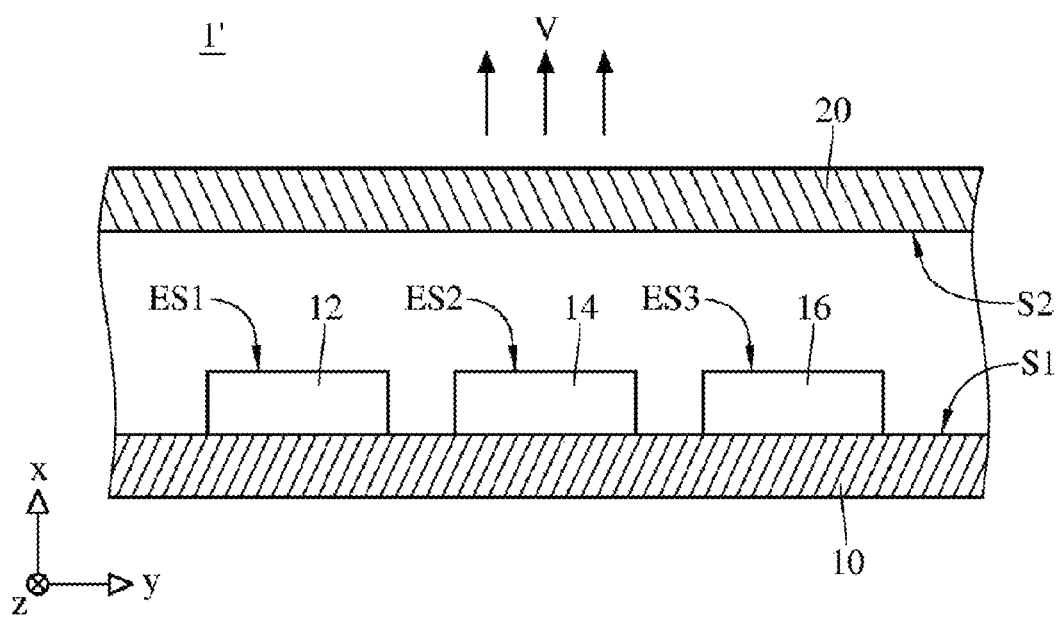
FIG. 3B is a schematic cross-sectional view showing another embodiment of a display panel according to the BB line of FIG. 1.

Please refer to FIG. 3A and FIG. 3B for further description of the shade layer. FIG. 3A and FIG. 3B show another sample of the display panel based on the first embodiment. FIG. 3A shows a cross-section schematic diagram based on the line AA in FIG. 1 for said another example, and FIG. 3B shows a cross-section schematic diagram based on the line BB in FIG. 1 for said another example. In this example, the display panel 1' further comprises a second substrate 20. Additionally, the second substrate 20 includes a second surface S2 facing the first substrate 10. The shading layer 18 is disposed on the second surface S2 of the second substrate 20, and the first color LEDs 12 and the second color LEDs 14 are disposed on the first substrate 10. In other words, instead of covering onto the first color LEDs 12 and the first substrate 10 by the shading layer 18 directly, there is a distance between the shading layer 18 and the first substrate 10. As FIG. 3A shows, the first light-emitting surface ES1 of the first color LED 12 is overlapped by the shading layer 18 in the display direction V; thus, the shading layer 18 blocks the light emitted by the first color LED 12 in the display direction V. In this embodiment, the second substrate 20 is a substrate with a property of high transparency, such as a glass substrate, a sapphire substrate or a polymer film. The shading layer 18 can be made by black matrix resists, opaque materials, multilayered Chromium film or resins.

Based on the above structure, the size of the LED Chip of the first color LED 12 is large for increasing its luminous efficiency. On the other hand, the light emitted by the first light-emitting surface ES1 of the first color LED 12 can be partly blocked in the display direction V by the shading layer 18 and the problem of light interference between adjacent pixel zones P will be improved.

Figure 4A:
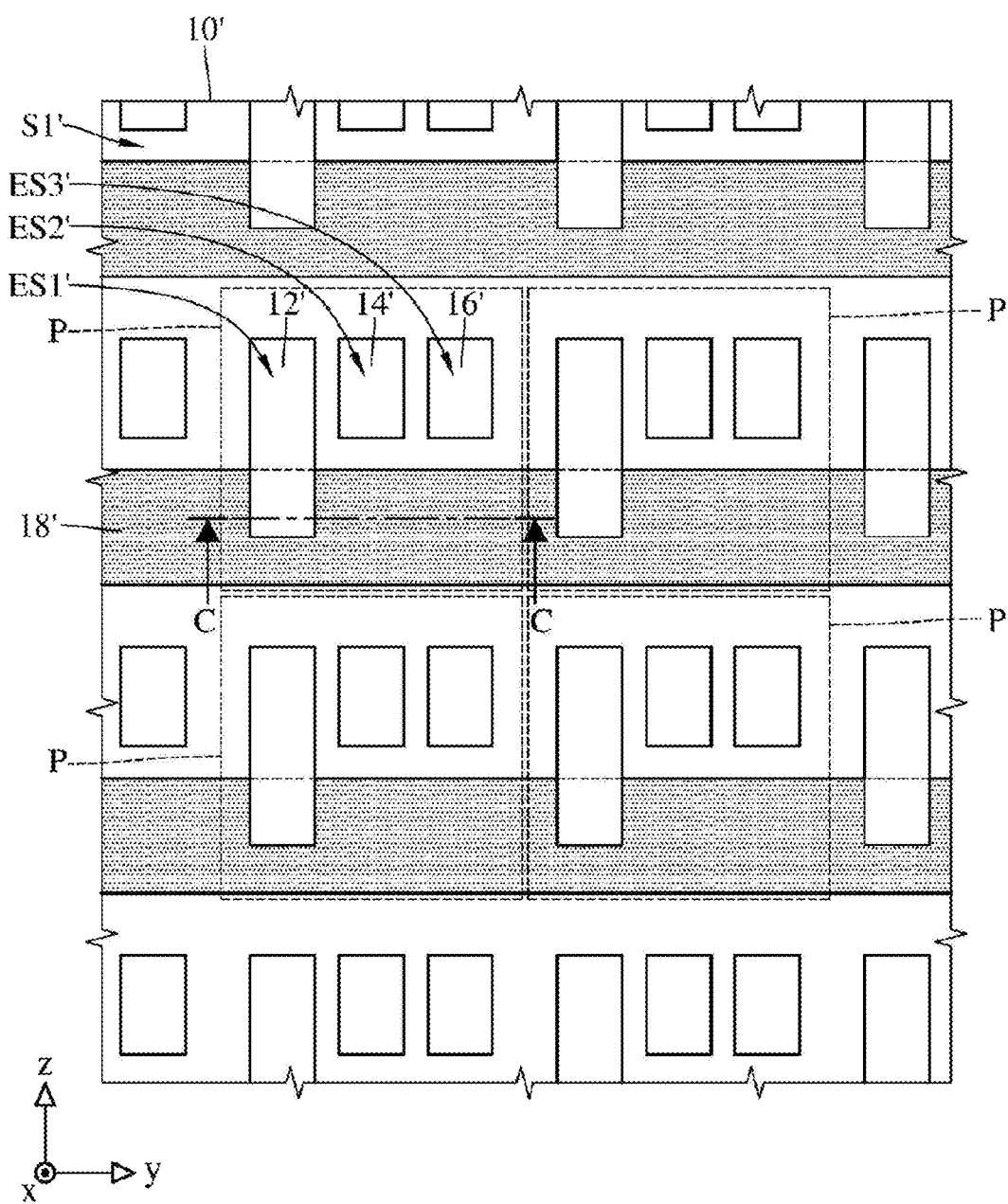
FIG. 4A is a schematic cross-sectional view of the AA line of FIG. 1 which showing another type of Light Emission of the display panel according to second embodiment.
Figure 4B:
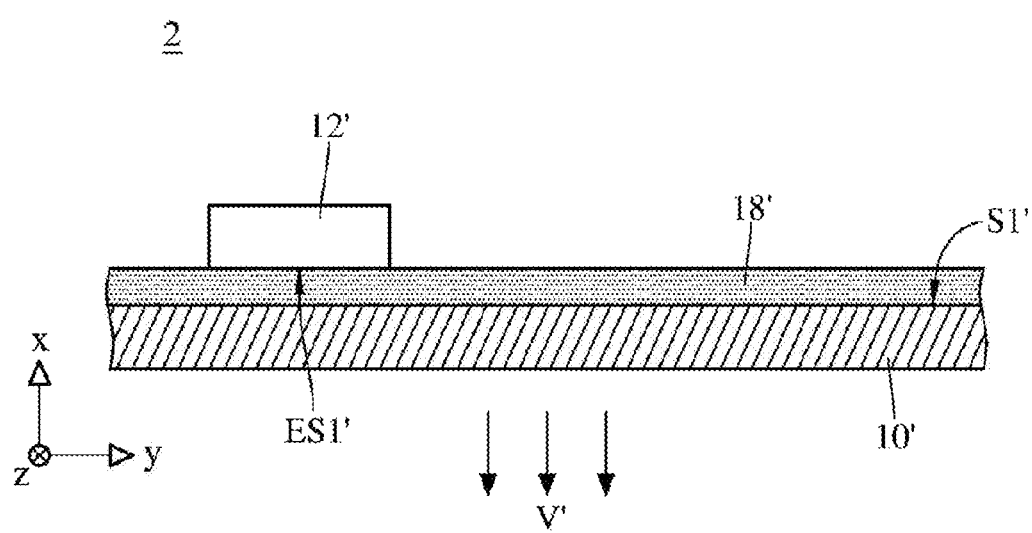
FIG. 4B is a schematic cross-sectional view of the BB line of FIG. 1 which showing another type of Light Emission of the display panel according to second embodiment.

Please refer to FIG. 4A and FIG. 4B. FIG. 4A is an overlook schematic diagram according to the display panel of the second embodiment, and FIG. 4B is a cross-sectional schematic diagram according to the CC line in FIG. 4A. A display panel 2 is similar to the display panel 1 in FIG. 1, wherein the display panel 2 comprises a first substrate 10', a plurality of first color LEDs 12', a plurality of second color LEDs 14', a plurality of third color LEDs 16' and a shading layer 18'. A main difference between this embodiment and the first embodiment lies in that, in this embodiment, the shading layer 18' of the display panel 2 is disposed on the first surface S1' of the first substrate 10', and the first color LED 12' is disposed on the shade layer 18'. Furthermore, the display direction V' is in the negative x-axis direction. Namely, the FIG. 1 to the FIG. 3B show the embodiments of the upward light-emitting structures, and both of the FIG. 4A and the FIG. 4B show the downward light-emitting structures. Said up light-emitting structure and the down light-emitting structure are defined based on the light-emitting direction from the display panel, which points to the first substrate or points away from the first substrate. As FIG. 4B shows, the shading layer 18' is disposed between the first substrate 10' and the first color LED 12', and the display direction V' points away from the first surface S1'. Hence, the shading layer 18' still partially overlaps the first light-emitting surface ES1' of the first color LED 12', wherein the first light-emitting surface ES1' faces to the first substrate 10' in the display direction V'. In addition, the second color LED 14' and the third color LED 16' are not overlapped by the shading layer 18' in the display direction V'. As FIG. 4B shows, every color LED is disposed on the first substrate 10', and the viewers watch the display panel 2 from the opposite side to the first surface S1' of the first substrate 10'. Because the light emitted from the first light-emitting surface ES1' of the first color LED 12' in display direction V' is partially blocked by the shade layer 18' appropriately, the interference between the color light emitted from the two adjacent first color LEDs 12' can be avoided.

Figure 5A:
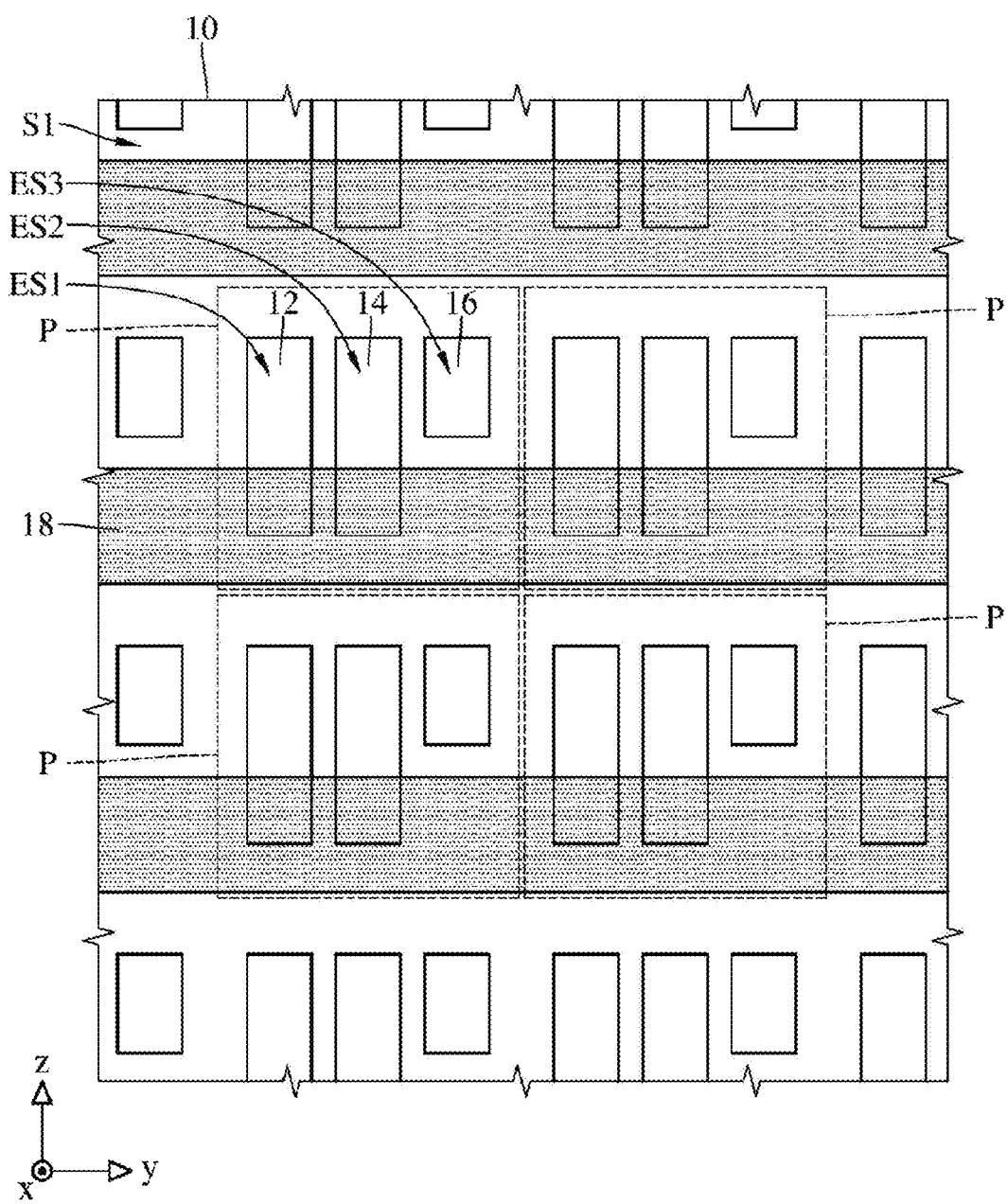
FIG. 5A is a structural schematic diagram of a display panel according to the third embodiment of the present disclosure.

Please refer to FIG. 5A. FIG. 5A is an overlook schematic diagram according to the display panel of the third embodiment. Similar to that of the embodiment shown in FIG. 1, a first substrate 10 of the third embodiment comprises a plurality of the pixel zones P and a first surface S1 facing to the display direction (positive x-axis). Every pixel zone P comprises a first color LED 12, a second color LED 14 and a third color LED 16. A first color LED 12 comprises a first light-emitting surface ES1. A second color LED 14 comprises a second light-emitting surface ES2. A third color LED 16 comprises a third light-emitting surface ES3. The first color LED 12, the second color LED 14 and the third color LED 16 are disposed on the first surface S1.

In FIG. 5A, the size of the second color LED 14 is larger than the size of the third color LED 16, so the area of the second light-emitting surface ES2 is also larger than the area of the third light-emitting surface ES3. Practically, the second color LED 14 emits the green light. Since the fluctuations of the wavelength shifting in blue color is obvious when the micro green light emitting diode (micro green LED) is made into miniature size, the wavelength-shift problem can be improved by using large size LED chip. Because human eyes are sensitive to the green light, the problem of interference between the color light emitted from different pixel zones P can be improved by disposing a shading layer 18. Also, a preferable color balance can be made by calibrating the light-emitted area of the second color LED 14. In practice, the area of the second light-emitting surface ES2 can be equal to or different from the area of the first light-emitting surface ES1. Thus, in the third embodiment, the light emitted from the first light-emitting surface ES1 of the first color LED 12 can be partially blocked by the shading layer 18. Also, the shading layer 18 overlaps part of the second light-emitting surface ES2 of the second color LED 14 in the display direction V.

Figure 5B:
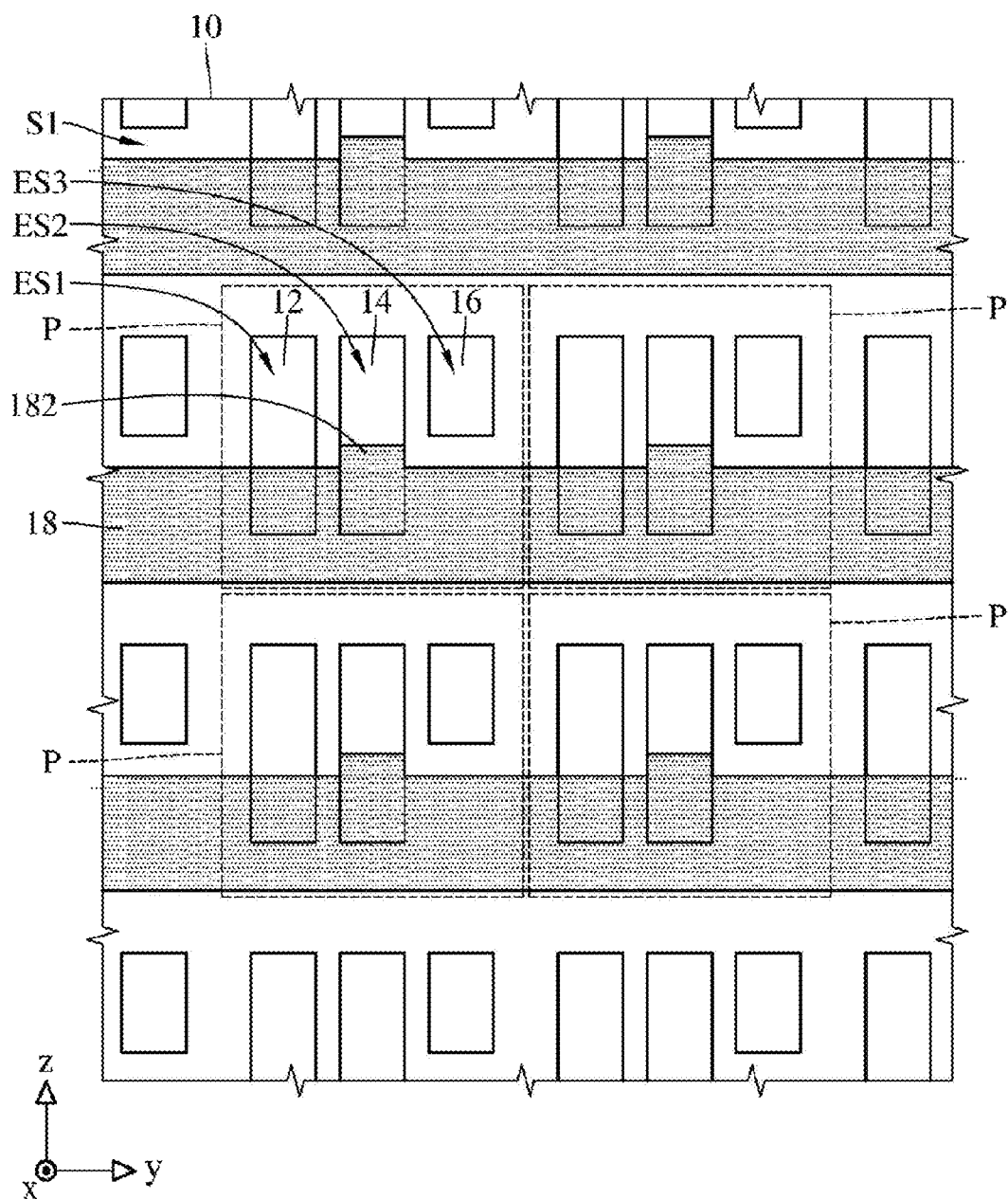
FIG. 5B is a structural schematic diagram of a display panel according to the fourth embodiment of the present disclosure.
Figure 6:
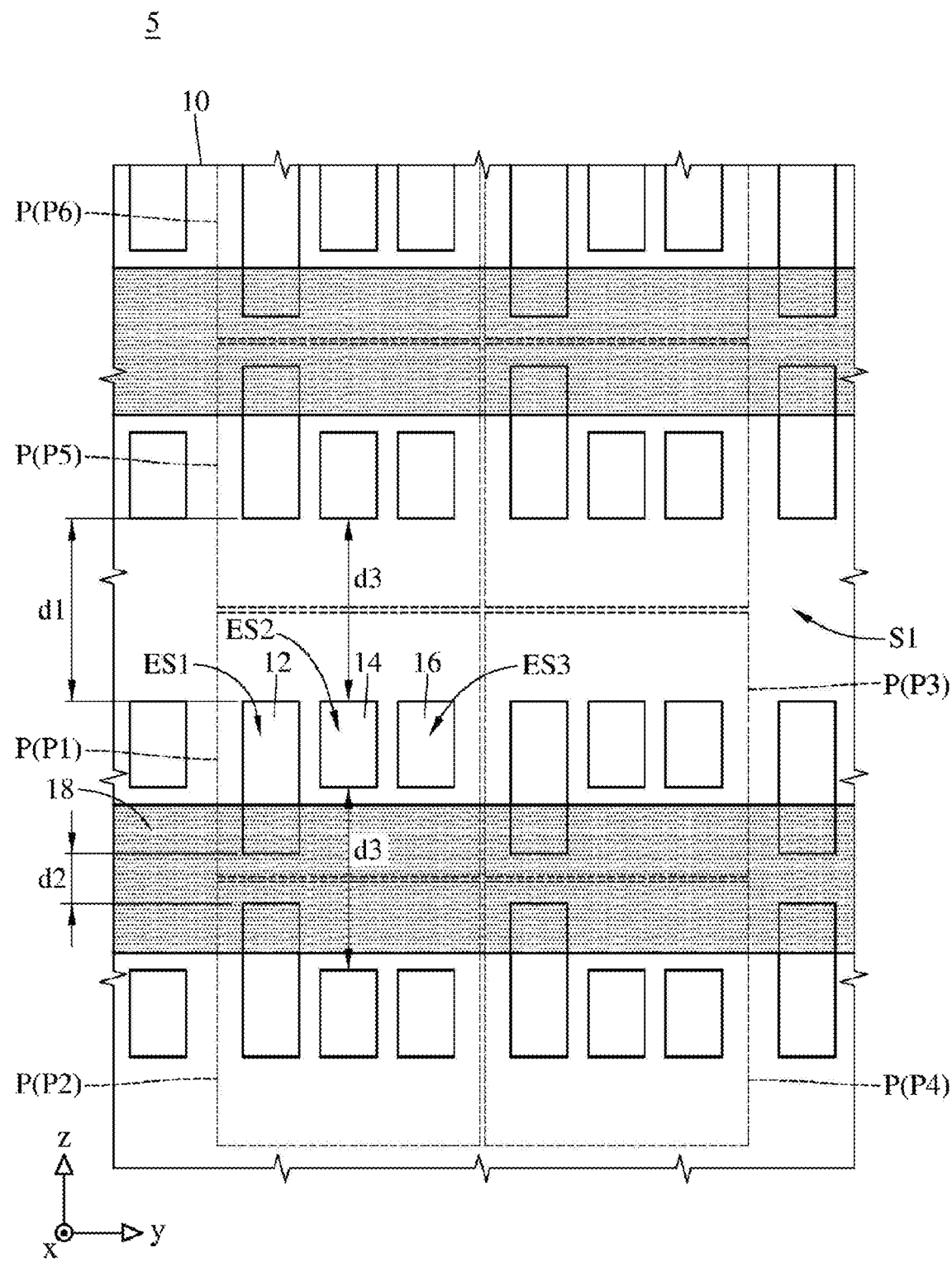
FIG. 6 is a structural schematic diagram of a display panel according to the fifth embodiment of the present disclosure.

On the other hand, as the description shown in the above, for improving the color balance, it needs to adjustments the blocked area of the light-emitting surface, which is blocked by the shading layer 18. Please refer to FIG. 5B for the detailed description. The FIG. 5B is an overlook schematic diagram according to the display panel in the fourth embodiment. In this embodiment, the display panel 4 is similar to the third embodiment shown in FIG. 5A, wherein the difference from the third embodiment is the shading layer 18 of the display panel 4 comprises an extra area 182. In addition, the extra area 182 faces to positive z-axis direction and comprises a larger overlapped area of the second light-emitting surface ES2. In other words, an area of the first light-emitting surface ES1 covered by the shading layer 18 differs from an area of the second light-emitting surface ES2 covered by the shading layer 18. Hence, the illuminance flux of the second color LED 14 disposed in each pixel zone P can be controlled appreciably by adjusting the size of the extra area 182. FIG. 5B is an example in which the second color LED 14 is overlapped partially by the extra area 182;

for the same reason, the first light-emitting surface ES1 of the first color LED 12 can also be partially overlapped by the extra area 182. Please refer to FIG. 6. FIG. 6 is an overlook schematic diagram according to the display panel in the fifth embodiment. The major difference from the previous embodiments is that: the first color LED 12, the second color LED 14 and the third color LED 16 are mirror-symmetrically arranged about the axis between two pixel zones P lining in two adjacent rows. In this embodiment, two adjacent pixel zones P in two adjacent rows are mirror-symmetrical or linear symmetrical about the axis between said two adjacent rows. Additionally, there is a distance d1 from the first color LED 12 disposed in a pixel zone P (for example, pixel zone P1) to another first color LED 12 disposed in adjacent pixel zone P (for example, pixel zone P5). There is another distance d2 from the first color LED 12 disposed in the pixel zone P1 to another first color LED 12 disposed in further another pixel zone P2, with the distance d1 larger than the distance d2. In other words, the pitch between the first color LEDs disposed on the first substrate 10 is different in both the z-axis direction. The second color LEDs 14 and the third color LEDs 16 have smaller size than the first color LEDs 12. Specifically, the first color LED 12 disposed in the pixel zone P1 is closer to the first color LED 12 disposed in the pixel zone P2 than to the first color LED 12 disposed in the pixel zone P5. Therefore, a shading layer 18 is disposed between the pixel zone P1 and the pixel zone P2, and there's no shading layer 18 disposed between the pixel zone P1 and the pixel zone P5 due to the wide gap between these two LEDs.

With the above structure, the process window provided by the pattern design of the shading layer 18 can be further widen due to the arrangement of the LEDs in this embodiment, so that the shading layer 18 overlaps both of part of the first light-emitting surface ES1 in the pixel zone P1 and part of the first light-emitting surface ES1 in the pixel zone P2. Similarly, the shading layer 18 also covers part of the first light-emitting surface ES1 in the pixel zone P5 and part of the first light-emitting surface ES1 in the pixel zone P6. Although only pixel zones P1, P2, P5 and P6 are described in this embodiment, people who have ordinary skill in this technical field can design the shade layers 18 for different applications according to this embodiment.

Figure 7:
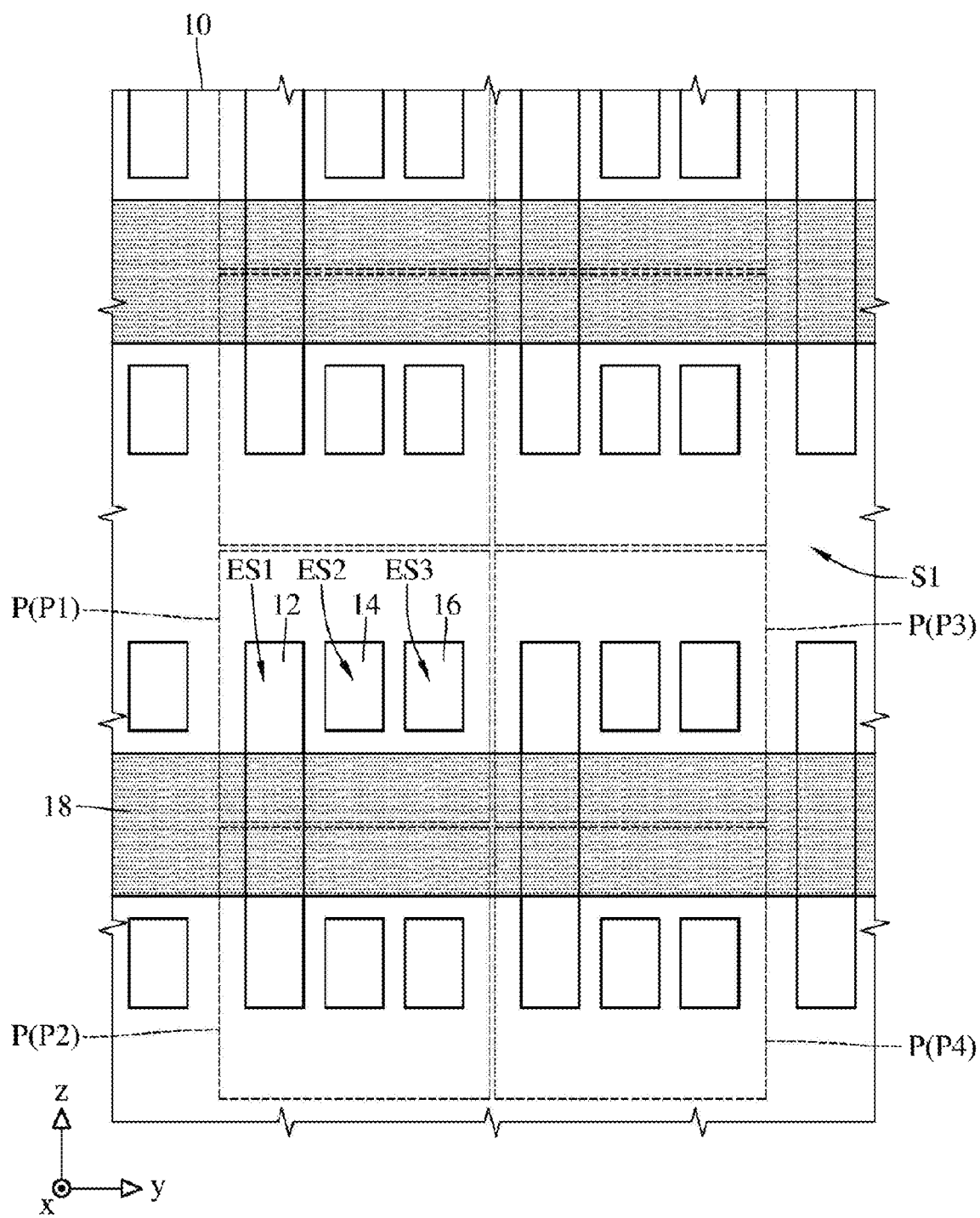
FIG. 7 is a structural schematic diagram of a display panel according to the sixth embodiment of the present disclosure.

Please refer to FIG. 7. FIG. 7 is an overlook schematic diagram according to the display panel in the sixth embodiment. The display panel 6 is similar to the fifth embodiment shown in FIG. 5 in this embodiment. The major difference from the fifth embodiment is that: two adjacent pixel zones P (for example, pixel zones P1 and P2) of the plurality of pixel zones P share one first color LED 12. Particularly, part of the first color LED 12 provides red light for the pixel zone P1, and another part of the first color LED 12 provides red light for the pixel zone P2. The shading layer 18 partially overlaps the first light-emitting surface ES1 in the display direction (positive x-axis) and is disposed between the pixel zone P1 and the pixel zone P2. Hence, the first light-emitting surface ES1 can be divided into two parts on two sides of the shading layer 18 in the pixel zone P1 and the pixel zone P2 respectively.

Figure 8:
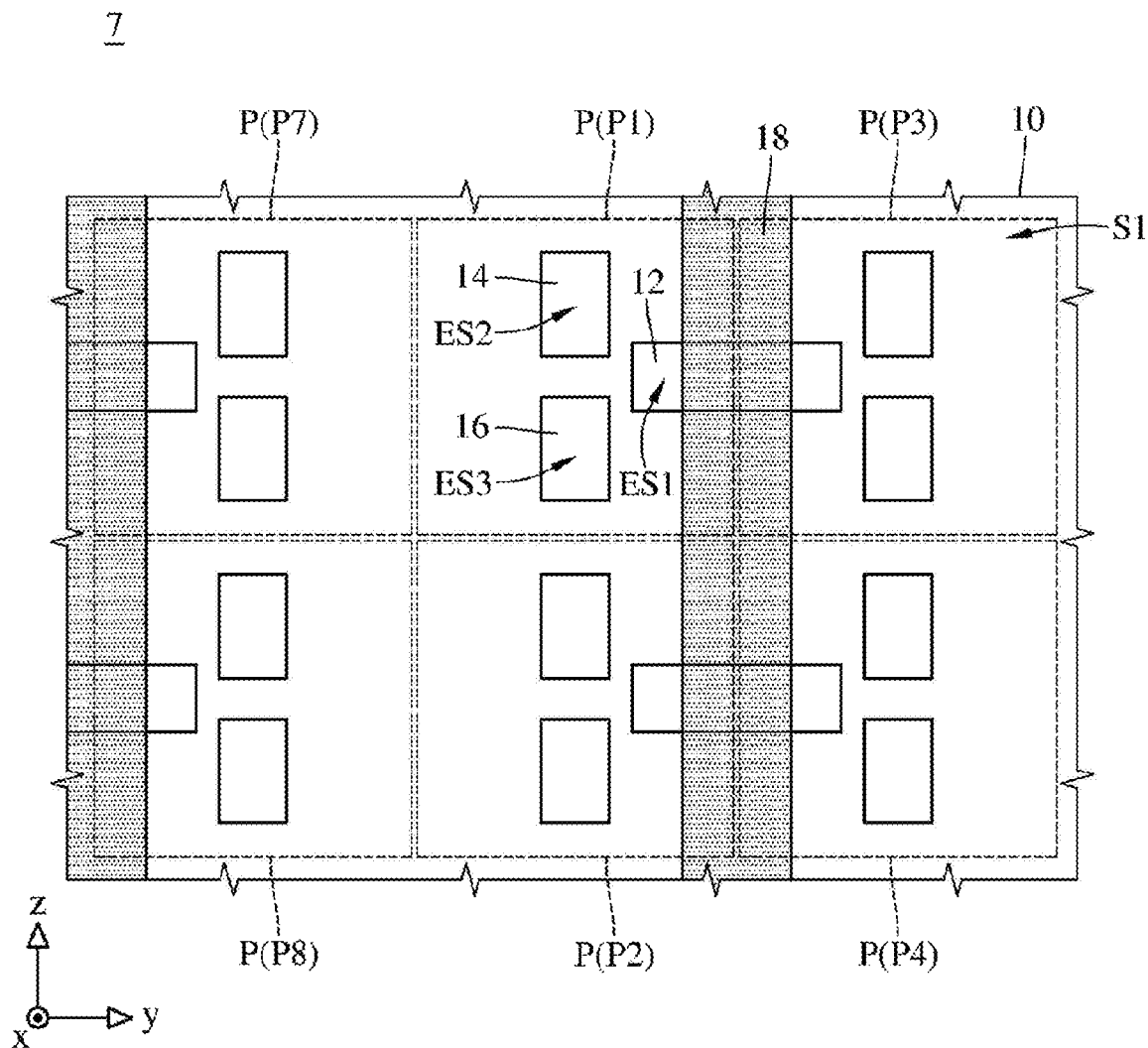
FIG. 8 is a structural schematic diagram of a display panel according to the seventh embodiment of the present disclosure.

Please refer to FIG. 8. FIG. 8 is an overlook schematic diagram according to the display panel of the seventh embodiment. The display panel 7 shown in FIG. 8 is similar to the sixth embodiment shown in FIG. 7. In this embodiment, the first color LEDs 12, the second color LEDs 14 and the third color LEDs 16 are disposed in two adjacent pixel zones P1 and P3, wherein the LEDs of the same color in these two pixel zones are mirror-symmetrically arranged about the symmetric axis between the two pixel zones P. Additionally, the shading layers 18 is disposed on the first surface S1, covers part of the first color LEDs 12 and extends in the z-axis direction. On the other hand, in this embodiment, the pixel zones P1 and P3 share one first color LED 12, and the pixel zones P2 and P4 share another one first color LED 12. The first color LEDs 12 are partially overlapped by the shading layer 18, so the related light-emitting areas in the pixel zone P1 and the pixel zone P3 can be defined. On the other hand, in the pixel zone P1, the second color LED 14 and the third color LED 16 are arranged along the z-axis direction, and the first color LED 12 is disposed on a side of the axis in which the second color LEDs 14 and the third color LEDs 16 align. Therefore, the first color LED 12, the second color LED 14 and the third color LED 16 are not collinear. Further referring to the structure in FIG. 8, since there is a larger distance between the first color LED 12 disposed in the pixel zone P1 and another first color LED 12 disposed in the pixel zone P7, the interference between the color light emitted by the pixel zone P7 and the light emitted by the first color LEDs 12 of the pixel zone P1 can be avoided without the shading layers 18.

Figure 9:
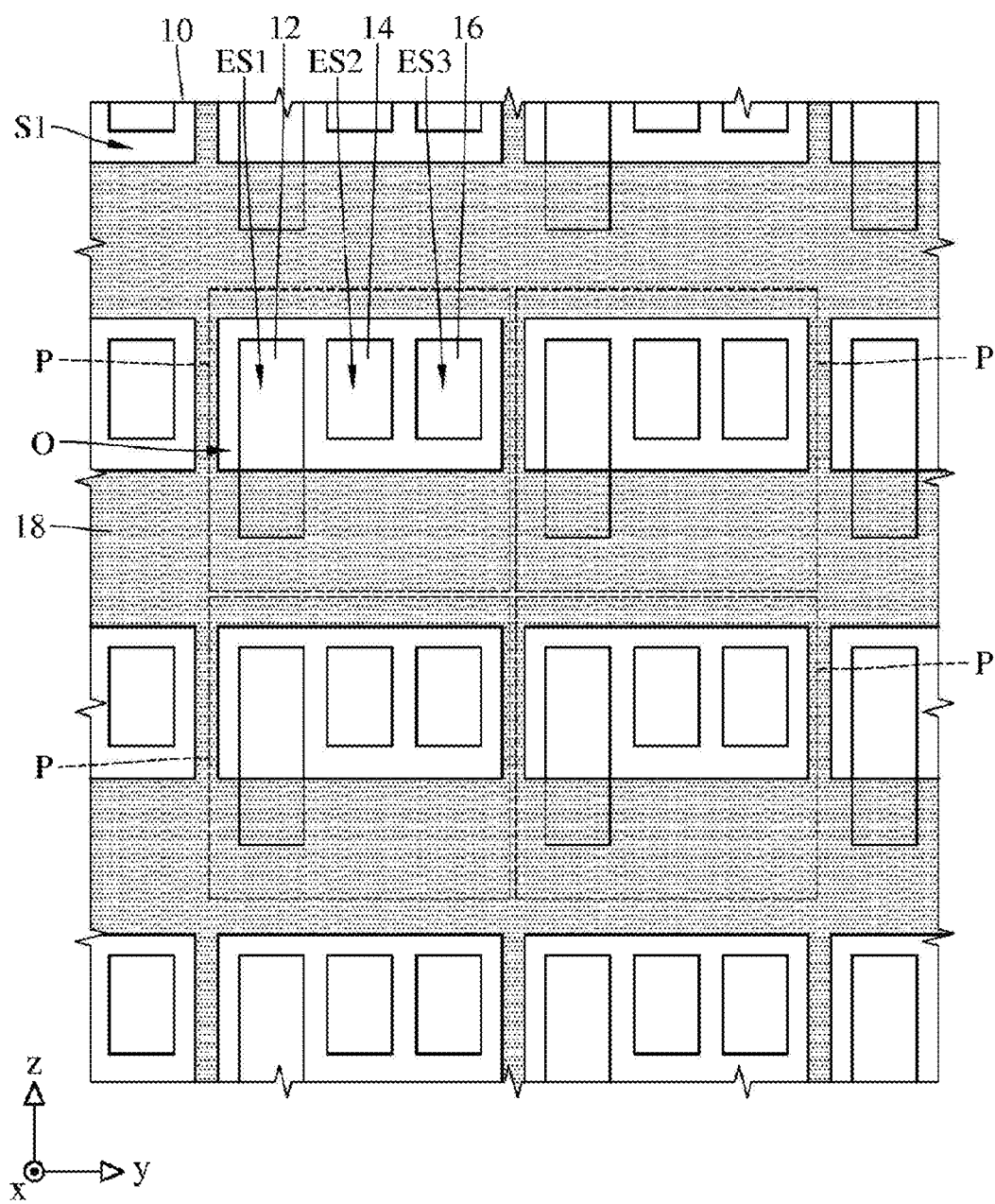
FIG. 9 is a structural schematic diagram of a display panel according to the eighth embodiment of the present disclosure.

Please refer to FIG. 9. FIG. 9 is an overlook schematic diagram according to the display panel in the eighth embodiment. In this embodiment, the display panel 8 is similar to the display panel 1 shown in FIG. 1. The major difference from the display panel 1 is that: the first substrate 10 is overlapped by the shading layers 18, and the shading layers 18 comprises a plurality of openings O. In addition, the openings O correspond to the plurality of pixel zones P respectively, and the openings O exposes part of the first light-emitting surface ES1 of the first color LED 12 and whole the second light-emitting surface ES2 of the second color LED 14. Specifically, a part of the first light-emitting surface ES1, the second light-emitting surface ES2 and the third light-emitting surface ES3 are uncovered by the shading layers 18. On the other hand, the first color LEDs 12, the second color LEDs 14 and the third color LEDs 16 are surrounded by the shading layers 18. Thus, the image contrast of the display panel 7 can be improved since the LEDs disposed in the different pixel zones are separated by the shading layers 18.

As the above descriptions, this present disclosure supplies a display panel which comprises light-emitting diodes (LEDs) with different colors, and the size of the first color LED 12 is larger than the size of the second color LED 14 or the size of the third color LED 16. In other words, the area of the first light-emitting surface ES1 is larger than the area of the second light-emitting surface ES2 or the area of the third light-emitting surface ES3. Moreover, the display panel comprises the shading layer which partially overlaps the first light-emitting surface ES1 in the display direction. Hence, the area of the light-emitting surface of the first color LED can be changed according to its luminous efficiency. Also, by the shading layers, the interference between the color light beams emitted by two adjacent pixel zones can be suppressed.

The reference numerals and some of the contents provided in the previous embodiment are used in the following embodiments, in which identical reference numerals indicate identical or similar components, and repeated descriptions of the same technical contents are omitted. Reference of the omitted parts can be found in the previous embodiment, and no repeated description is provided in the following embodiments.

Figure 10:
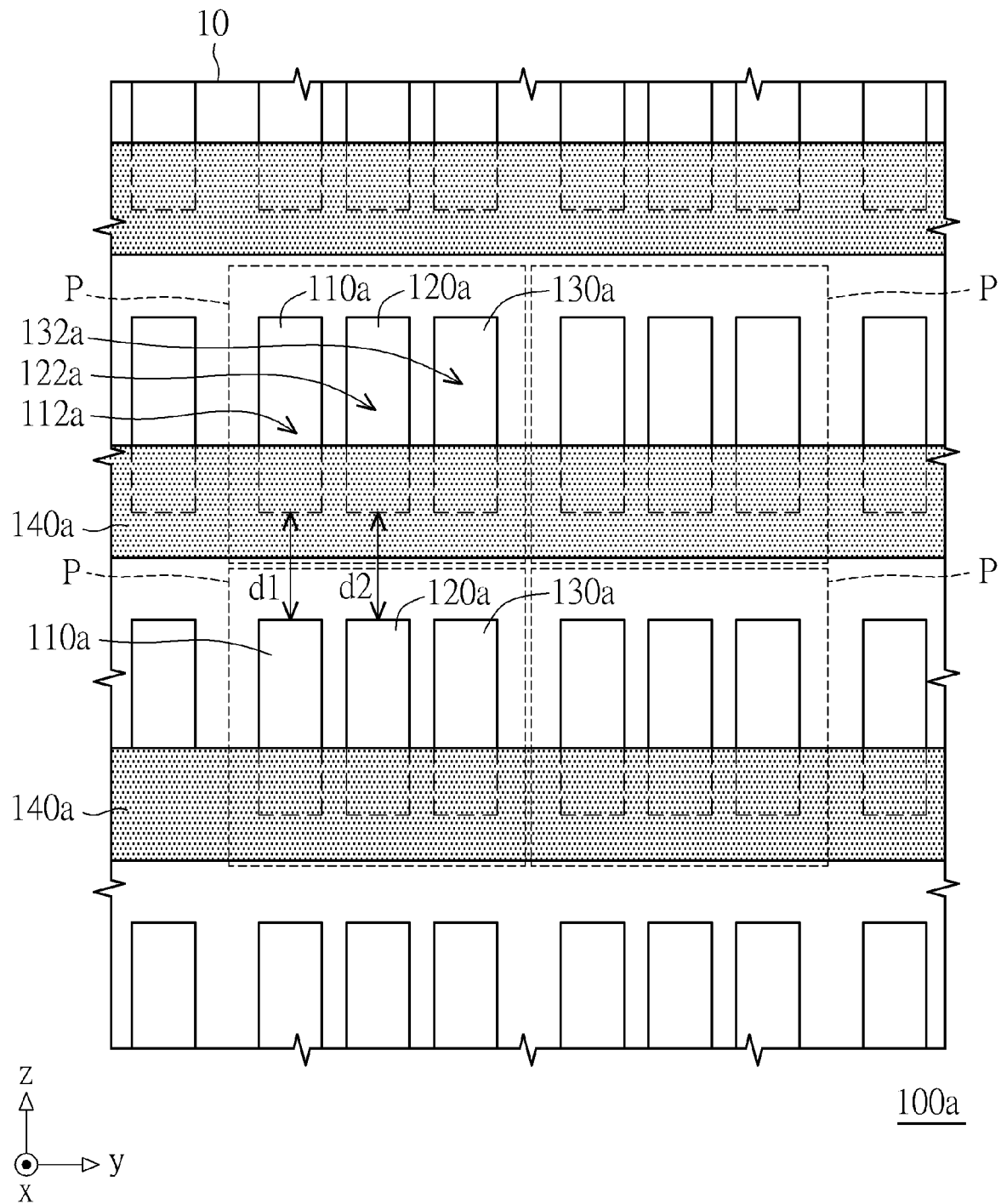
FIG. 10 is a structural schematic diagram of a display panel according to the embodiment of the present disclosure.

FIG. 10 is a structural schematic diagram of a display panel according to the embodiment of the present disclosure. Referring to both FIG. 1A and FIG. 10, a display panel 100a provided in the embodiment is similar to the display panel 1 depicted in FIG. 1A, and the difference therebetween is as follows: a display panel 100a includes a first substrate 10, a plurality of first color LEDs 110a, a plurality of second color LEDs 120a and a shading layer 140a. The first substrate 10 has a plurality of pixel zones P arranged in an array form. Each of the first color LEDs 110a has a first light emitting surface 112a facing to a display direction V (shown in FIG. 2A). Each of the second color LEDs 120a has a second light emitting surface 122a facing to the display direction V. Each of the pixel zones P is provided with one of the first color micro LEDs 110a and one of the second color LEDs 120a. The shading layer 140a is disposed in the pixel zones P. The shading layer 140a overlaps part of the first light emitting surface 112a and part of the second light emitting surface 122a in the display direction V.

In more detail, the display panel 100a further includes a plurality of third color LEDs 130a. Each of the third color LEDs 130a has a third light emitting surface 132a facing to the display direction V (shown in FIG. 2A). Herein, each of the pixel zones P is provided with one of the first color micro LEDs 110a, one of the second color LEDs 120a and one of the third color LEDs 130a, and the shading layer 140a also overlaps part of the third light emitting surface 132a in the display direction V. As shown in FIG. 10, a size of the first color LED 110a, a size of the second color LED 120a, and a size of the third color LED 130a are the same, and the shading layer 140a overlaps part of the first light emitting surface 112a, part of the second light emitting surface 122a, and part of the third light emitting surface 132a in the display direction V (shown in FIG. 2A). A distance d1 between two adjacent first color LEDs 110a is the same as a distance d2 between two adjacent second color LEDs 120a. As shown in FIG. 10, an area of the first light emitting surface 112a covered by the shading layer 140a is the same as an area of the second light emitting surface 122a covered by the shading layer 140a, and the area of the second light emitting surface 122a covered by the shading layer 140a is the same as an area of the third light emitting surface 132a covered by the shading layer 140a. Herein, an area of the first light emitting surface 112a exposed by the shading layer 140a is the same as an area of the second light emitting surface 122a exposed by the shading layer 140a, and the area of the second light emitting surface 122a exposed by the shading layer 140a is the same as an area of the third light emitting surface 132a exposed by the shading layer 140a.

Furthermore, a maximum width of the first light emitting surface 112a and a maximum width of the second light emitting surface 122a are respectively, for example, 10 micrometers to 150 micrometers. Similarly, a maximum width of the third light emitting surface 132a is, for example, 10 micrometers to 150 micrometers. A maximum width of the first light emitting surface 112a exposed by the shading layer 140a and a maximum width of the second light emitting surface 122a exposed by the shading layer 140a are respectively, for example, less than 50 micrometers. Similarly, a maximum width of the third light emitting surface 132a exposed by the shading layer 140a is for example, less than 50 micrometers. Micro LEDs have poor efficiency due to their small size. If the size of the micro LED is made larger, the black occupancy ratio of the screen is low, resulting in poor contrast. By making a larger size micro LED, it can have better efficiency, and through the cover of the shading layer, the exposed area of the micro LED can have both the luminous efficiency and the larger black occupancy ratio, which can have a better display effect.

In one embodiment, a ratio of the shading layer 140a in each of the pixel zones P is larger than the first light emitting surface 112a, the second light emitting surface 122a or the third light emitting surface 132a in each of the pixel zones P, the invention is not limited thereto. In other embodiment, a ratio of the shading layer 140a in each of the pixel zones P can be larger than the sum of the first light emitting surface 112a, the second light emitting surface 122a and the third light emitting surface 132a in each of the pixel zones P. Preferably, a ratio of the shading layer 140a in each of the pixel zones P is greater than or equal to 50%. When the ratio of the shading layer 140a in each of the pixel zones P is higher, the display panel 100a can have a higher contrast.

Figure 11:
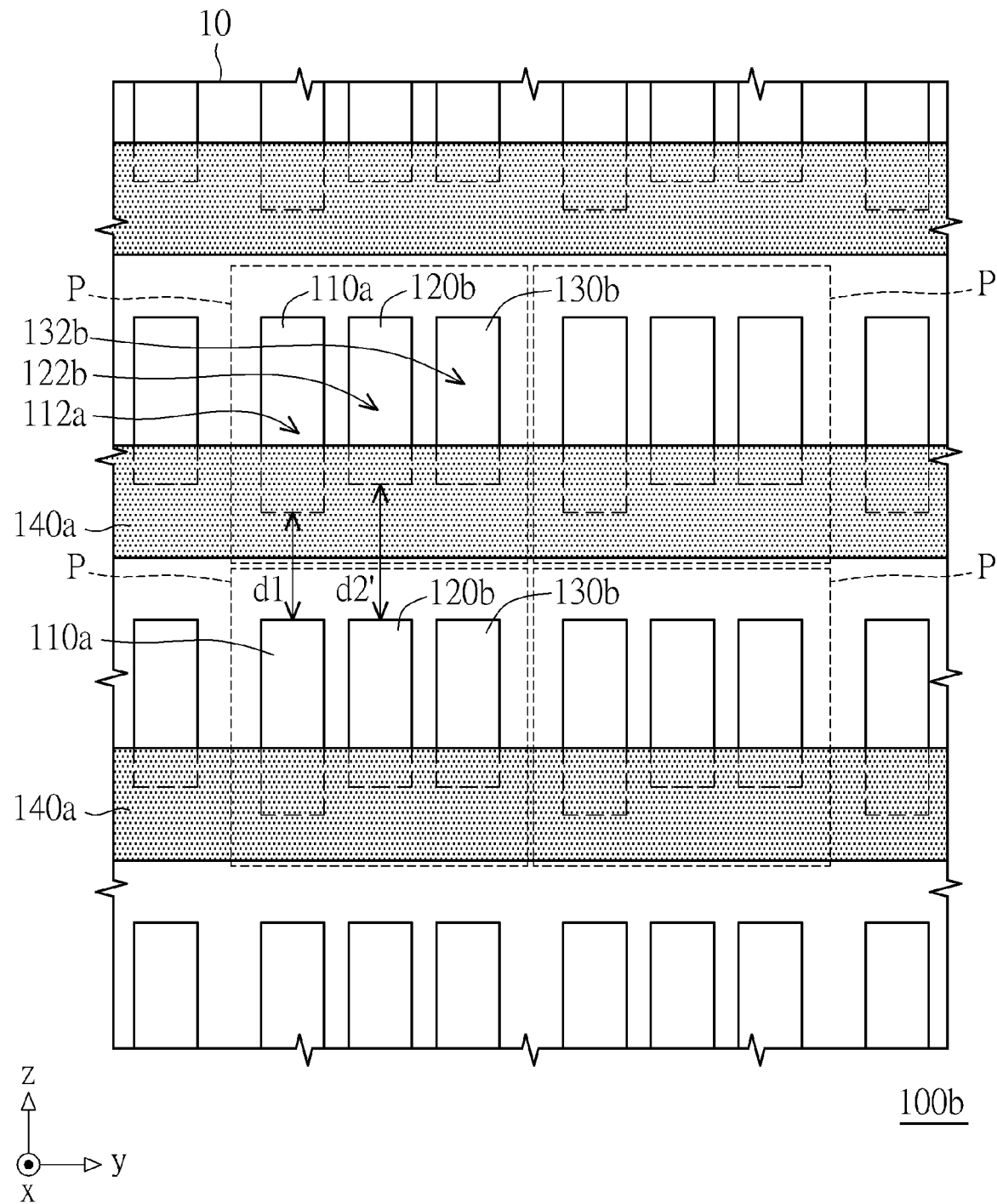
FIG. 11 is a structural schematic diagram of a display panel according to another embodiment of the present disclosure.

FIG. 11 is a structural schematic diagram of a display panel according to another embodiment of the present disclosure. Referring to both FIG. 10 and FIG. 11, a display panel 100b provided in the embodiment is similar to the display panel 100a depicted in FIG. 10, and the difference therebetween is as follows: a size of the first color LED 110a is larger than a size of the second color LED 120b, and the size of the second color LED 120b is the same as a size of the third color LED 130b. The distance d1 between two adjacent first color LEDs 110a is less than the distance d2' between two adjacent second color LEDs 120b. In more detail, a light emitting area of each of the first color LEDs 110a is different from a light emitting area of each of the second color LEDs 120b. Herein, an area of the first light emitting surface 112a is larger than an area of the second light emitting surface 122b and an area of the third light emitting surface 132b. An area of the first light emitting surface 112a covered by the shading layer 140a is larger than an area of the second light emitting surface 122b covered by the shading layer 140a and an area of the third light emitting surface 132b covered by the shading layer 140a. A wavelength of the first color LEDs 110a is greater than a wavelength of the second color LEDs 120b. In practice, the second color LED 120b is used to provide red light, for example. Since the small-sized red micro LED has poor luminous efficiency, the problem can be improved by using larger-sized die. In addition, the large-sized red micro LED has a better process yield.

Figure 12:
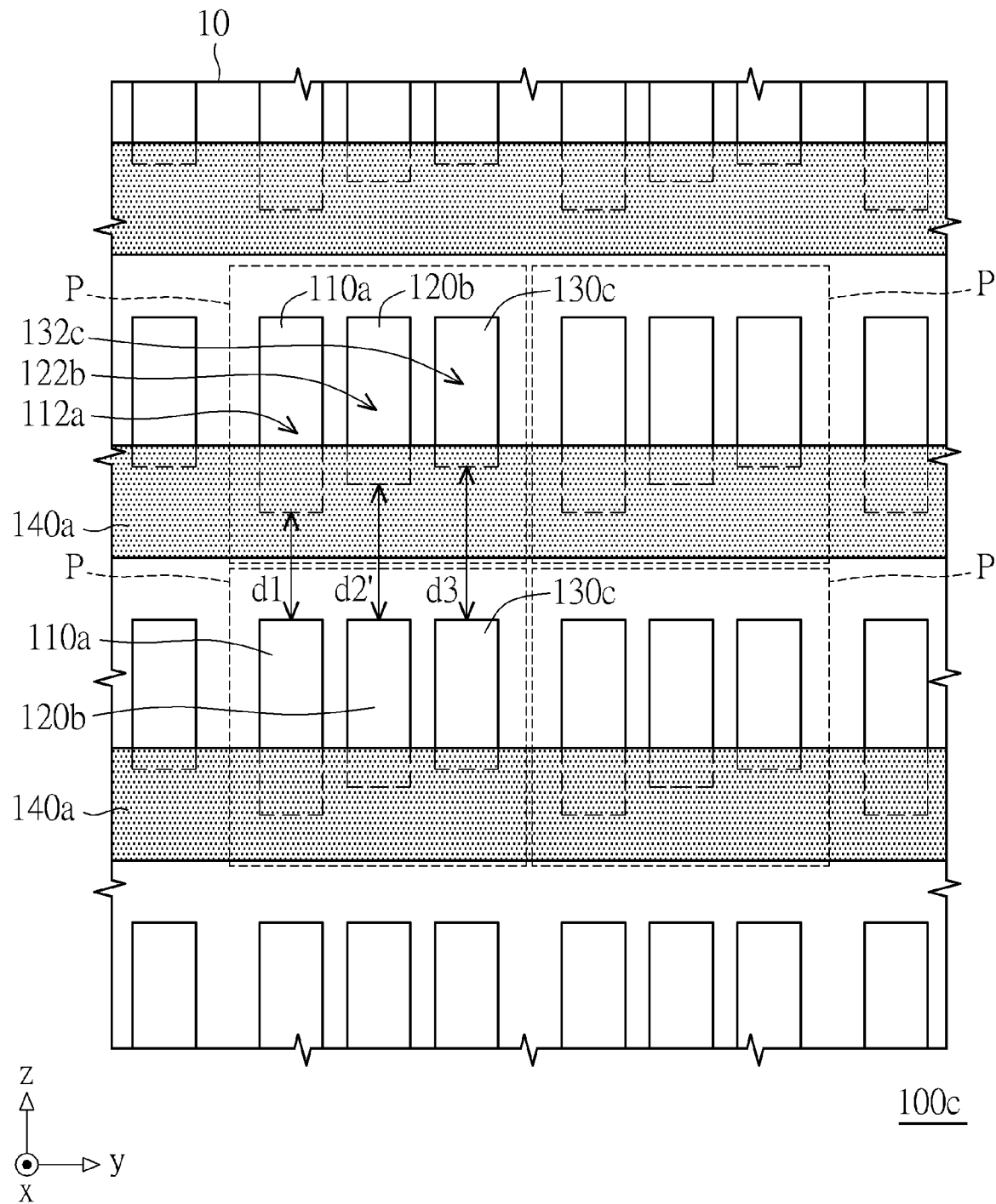
FIG. 12 is a structural schematic diagram of a display panel according to another embodiment of the present disclosure.

FIG. 12 is a structural schematic diagram of a display panel according to another embodiment of the present disclosure. Referring to both FIG. 10 and FIG. 12, a display panel 100c provided in the embodiment is similar to the display panel 100a depicted in FIG. 10, and the difference therebetween is as follows: the size of the first color LED 110a is larger than the size of the second color LED 120b, and the size of the second color LED 120b is larger than a size of the third color LED 130c. The distance d1 between two adjacent first color LEDs 110a is less than the distance d2' between two adjacent second color LEDs 120b, and the distance d2' between two adjacent second color LEDs 120b is less than the distance d3 between two adjacent third color LEDs 120c. The wavelength of the first color LEDs 110a is greater than the wavelength of the second color LEDs 120b, and the wavelength of the second color LEDs 120b is greater than a wavelength of the third color LEDs 130c. As shown in FIG. 12, an area of the first light emitting surface 112a covered by the shading layer 140a is larger than an area of the second light emitting surface 122b covered by the shading layer 140a, and the area of the second light emitting surface 122b covered by the shading layer 140a is larger than an area of the third light emitting surface 132c covered by the shading layer 140*a*. Herein, an area of the first light emitting surface 112*a* is larger than an area of the second light emitting surface 122*b*, and the area of the second light emitting surface 122*b* is larger than an area of the third light emitting surface 132*c*. An area of the first light emitting surface 112*a* exposed by the shading layer 140*a* is the same as an area of the second light emitting surface 122*b* exposed by the shading layer 140*a*, and the area of the second light emitting surface 122*b* exposed by the shading layer 140*a* is the same as an area of the third light emitting surface 132*c* exposed by the shading layer 140*a*.

In practice, the second color LED 120*b* is used to provide, for example, green light, and the third color LED 130*c* is used to provide, for example, blue light. Since the small-sized green micro LED has obvious changes in wavelength blue shift, the problem can be improved by using larger-sized die. In addition, since human eyes are more sensitive to green light, the shading layer 140*a* can not only avoid the interference between the color light beams emitted by two adjacent pixel zones P, but also control the light emitting area of the second color LED 120*b* to achieve a good color balance. The blue light has good luminous efficiency and can be smaller in size to increase wafer utilization.

Figure 13:
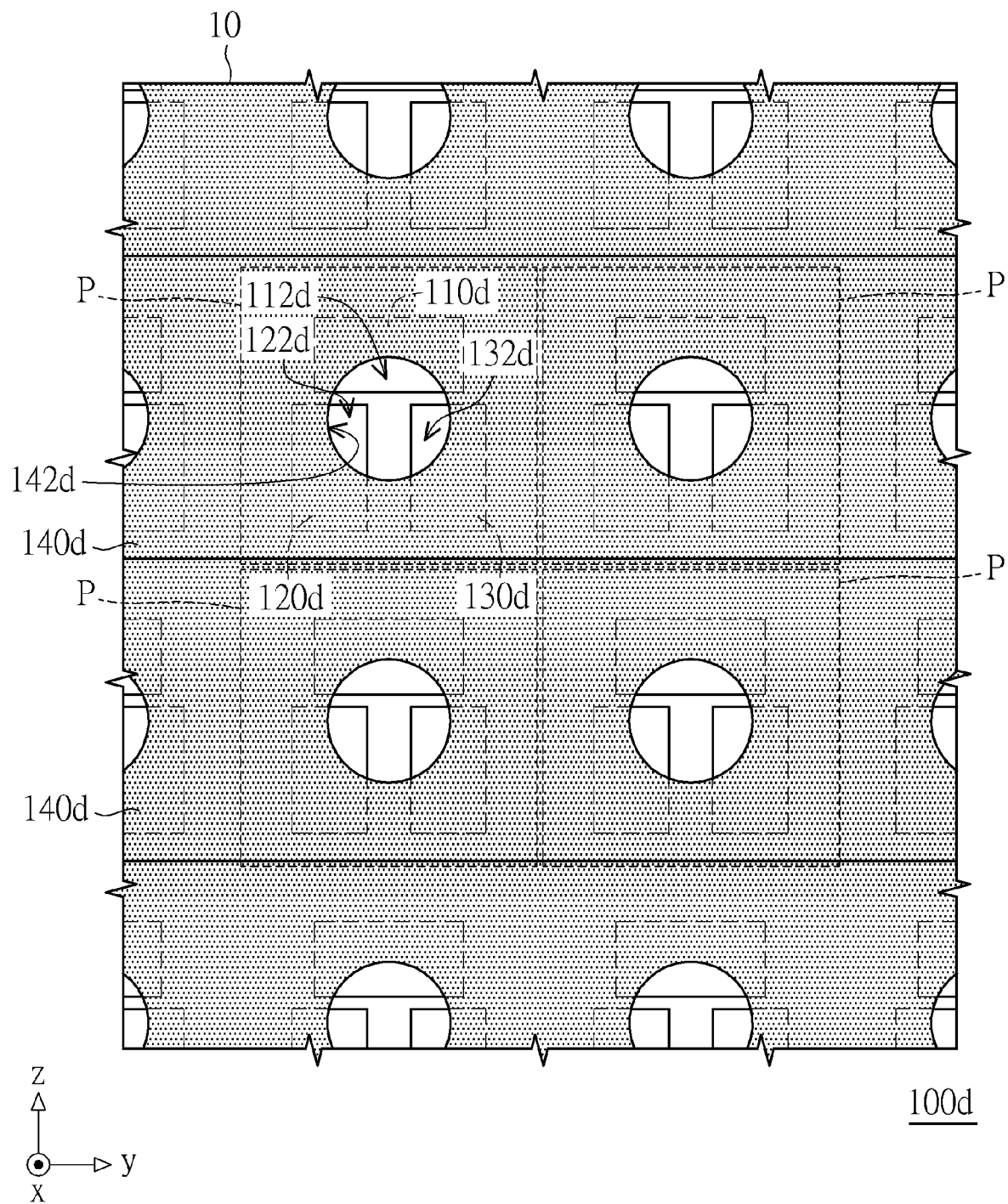
FIG. 13 is a structural schematic diagram of a display panel according to another embodiment of the present disclosure.

FIG. 13 is a structural schematic diagram of a display panel according to another embodiment of the present disclosure. Referring to both FIG. 10 and FIG. 13, a display panel 100*d* provided in the embodiment is similar to the display panel 100*a* depicted in FIG. 10, and the difference therebetween is as follows: an arrangement direction of the first color LEDs 110*d* is different from an arrangement direction of the second color LEDs 120*d*, and the arrangement direction of the first color LEDs 110*d* is different from an arrangement direction of the third color LEDs 130*d*. Herein, the first color LED 110*d*, the second color LED 120*d* and the third color LED 130*d* are not collinear, which can prevent the light provided in the pixel zones P from being interfered with each other in the pixel zones P. As shown in FIG. 13, the first color LED 110*d*, the second color LED 120*d* and the third color LED 130*d* are arranged for example, in a U shape, so that the space utilization efficiency is high.

Furthermore, the shading layer 140*d* includes a plurality of openings 142*d* corresponding to the pixel zones P. Each of the openings 142*d* expose part of the first light emitting surface 112*d* of each of the first color LEDs 110*d*, part of the second light emitting surface 122*d* of each of the second color LEDs 120*d*, and part of the third light emitting surface 132*d* of each of the third color LEDs 130*d*. A light emitting area of each of the first color LEDs 110*d* is the same as a light emitting area of each of the second color LEDs 120*d* and the same as a light emitting area of each of the third color LEDs 130*d*. In other words, an area of the first light emitting surface 112*d*, an area of the second light emitting surface 122*d* and an area of the third light emitting surface 132*d* are the same. A luminous efficiency of each of the first color LEDs 110*d* is different from a luminous efficiency of each of the second color LEDs 120*d*. Preferably, the luminous efficiency of each of the first color LEDs 110*d* is greater than the luminous efficiency of each of the second color LEDs 120*d*. An area of the first light emitting surface 112*d* exposed by the shading layer 140*d*, an area of the second light emitting surface 122*d* exposed by the shading layer 140*d* and an area of the third light emitting surface 132*d* exposed by the shading layer 140*d* are the same.

Figure 14:
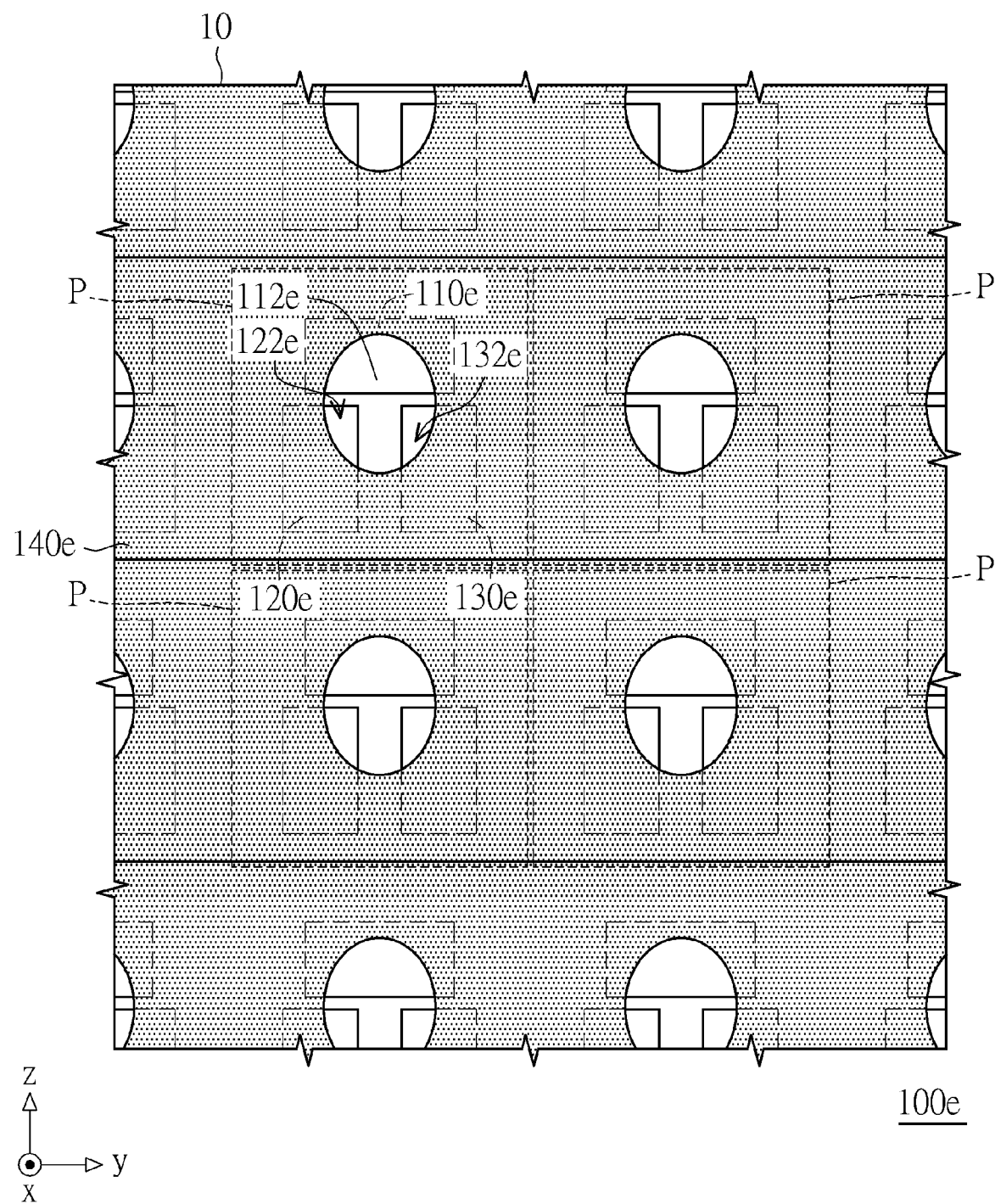
FIG. 14 is a structural schematic diagram of a display panel according to another embodiment of the present disclosure.

FIG. 14 is a structural schematic diagram of a display panel according to another embodiment of the present disclosure. Referring to both FIG. 13 and FIG. 14, a display panel 100*e* provided in the embodiment is similar to the display panel 100*d* depicted in FIG. 13, and the difference therebetween is as follows: an area of the first color LED 110*e* exposed by the shading layer 140*e* is different from an area of the second color LED 120*e* exposed by the shading layer 140*e* and different from an area of the third color LED 130*e* exposed by the shading layer 140*e*. In the embodiment, an area of the first light emitting surface 112*e* exposed by the shading layer 140*e* is larger than an area of the second light emitting surface 122*e* exposed by the shading layer 140*e*, and an area of the third light emitting surface 132*e* exposed by the shading layer 140*e* is the same as an area of the second light emitting surface 122*e* exposed by the shading layer 140*e*. In other embodiment, an area of the third light emitting surface 132*e* exposed by the shading layer 140*e* can be the same as an area of the first light emitting surface 112*e* exposed by the shading layer 140*e*. The first color LED 110*e* is, for example, red LED. Since the efficiency of the red LED is poor, when the light emitting surface is the same, it will be better to expose the larger light emitting surface of the red light. Herein, a wavelength of the first color LEDs 110*e* is greater than a wavelength of the second color LEDs 120*e*, and an area of the first light emitting surface 112*e* exposed by the shading layer 140*e* is larger than an area of the second light emitting surface 122*e* exposed by the shading layer 140*e*. Preferably, when the wavelength of the LED is larger, the light emitting surface of LED exposed by the shading layer is larger.

Figure 15:
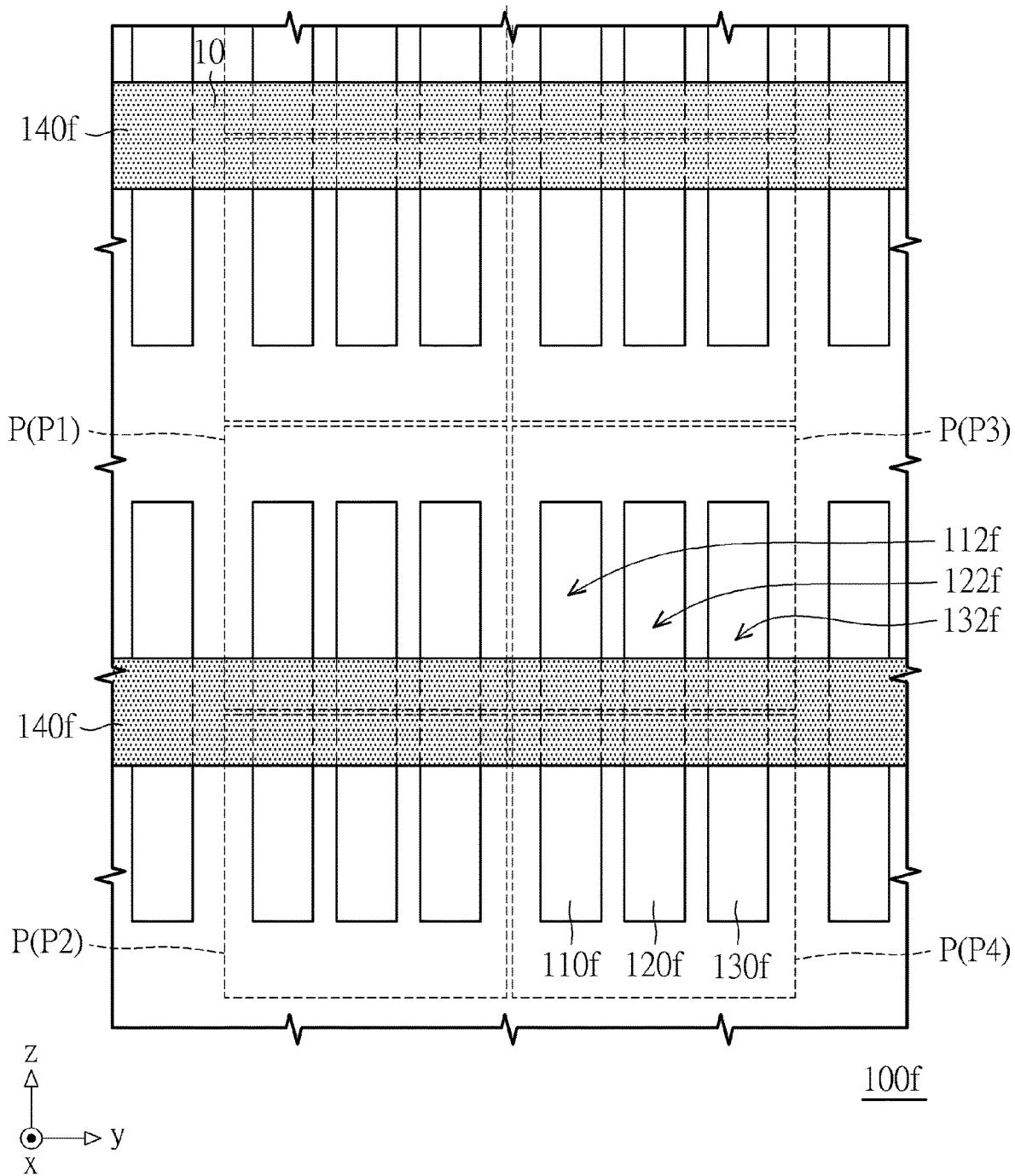
FIG. 15 is a structural schematic diagram of a display panel according to another embodiment of the present disclosure.

FIG. 15 is a structural schematic diagram of a display panel according to another embodiment of the present disclosure. Referring to both FIG. 10 and FIG. 15, a display panel 100*f* provided in the embodiment is similar to the display panel 100*a* depicted in FIG. 10, and the difference therebetween is as follows: two adjacent pixel zones P (for example, pixel zones P1 and P2) of the pixel zones P share one first color LED 110*f*, one of the second LED 120*f*, and one third color LED 130*f*, the invention is not limited thereto. In other embodiment, two adjacent pixel zones P (for example, pixel zones P1 and P2) of the pixel zones P can share at least one of the first color LED 110*f*, the second color LED 120*f* and the third color LED 130*f*. Particularly, part of the first color LED 110*f* provides red light for the pixel zone P1, and another part of the first color LED 110*f* provides red light for the pixel zone P2. Similarly, part of the second color LED 120*f* provides green light for the pixel zone P1, and another part of the second color LED 120*f* provides green light for the pixel zone P2. Part of the third color LED 130*f* provides blue light for the pixel zone P1, and another part of the third color LED 130*f* provides blue light for the pixel zone P2. The shading layer 140*f* overlaps part of the first light emitting surface 112*f*, part of the second light emitting surface 122*f*, and part of the third light emitting surface 132*f* in the display direction (positive x-axis) and is disposed between the pixel zone P1 and the pixel zone P2. Hence, the first light emitting surface 112*f*, the second light emitting surface 122*f*, and the third light emitting surface 132*f* can be divided into two parts on two sides of the shading layer 140*f* in the pixel zone P1 and the pixel zone P2 respectively, and utilization can be increased.

Figure 16:
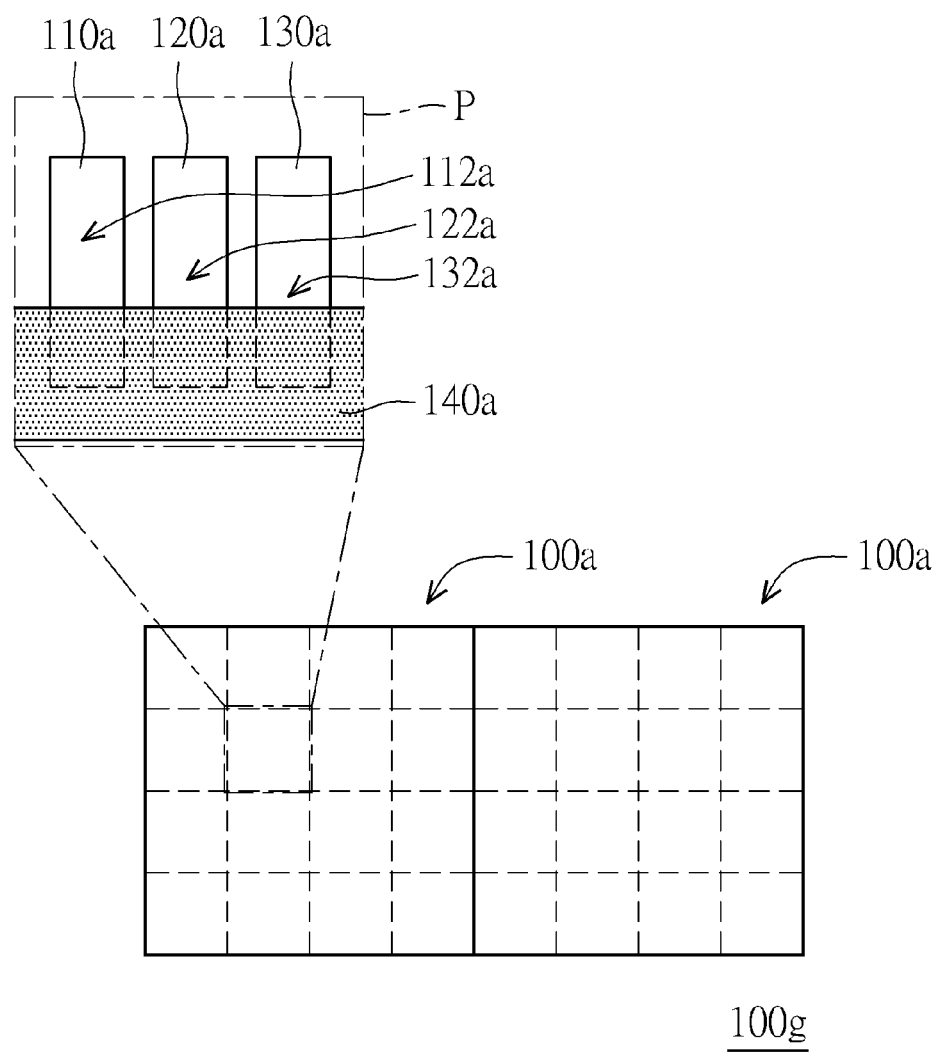
FIG. 16 is a structural schematic diagram of a display panel according to another embodiment of the present disclosure.

FIG. 16 is a structural schematic diagram of a display panel according to another embodiment of the present disclosure. Referring to both FIG. 10 and FIG. 16, a display panel 100*g* provided in the embodiment is similar to the display panel 100*a* depicted in FIG. 10, and the difference therebetween is as follows: in order to implement a large-sized display, two display panel 100*a* are spliced into a large-sized display panel 100*g*. In detail, the display panel 100a has for example, 4×4 pixel zones P, and every 4×4 pixel zones P can be spliced with other 4×4 pixel zones P, the invention is not limited thereto.

To sum up, the display panel includes the shading layer which overlaps part of the first light emitting surface and part of the second light emitting surface in the display direction. Hence, the area of the light emitting surface of the first color LED and the area of the light emitting surface of the second color LED can be changed according to its luminous efficiency. Furthermore, by the shading layer, the interference between the color light beams emitted by two adjacent pixel zones can be suppressed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
   a first substrate having a plurality of pixel zones arranged in an array form;
   a plurality of first color micro light emitting diodes (LEDs), each of the plurality of first color micro LEDs having a first light emitting surface facing to a display direction;
   a plurality of second color micro LEDs, each of the plurality of second color micro LEDs having a second light emitting surface facing to the display direction, wherein each of the plurality of pixel zones is provided with one of the plurality of first color micro LEDs and one of the plurality of second color micro LEDs, wherein a maximum width of the first light emitting surface and a maximum width of the second light emitting surface are respectively 10 micrometers to 150 micrometers; and
   a shading layer disposed in the plurality of pixel zones, wherein the shading layer overlaps part of the first light emitting surface and part of the second light emitting surface in the display direction.

2. The display panel according to claim 1, wherein an area of the first light emitting surface is larger than an area of the second light emitting surface.

3. The display panel according to claim 2, wherein a wavelength of the plurality of first color micro LEDs is greater than a wavelength of the plurality of second color micro LEDs.

4. The display panel according to claim 1, wherein an area of the first light emitting surface exposed by the shading layer is the same as an area of the second light emitting surface exposed by the shading layer.

5. The display panel according to claim 1, further comprising:
   a plurality of third color micro LEDs, each of the plurality of third color micro LEDs having a third light emitting surface facing to the display direction, wherein each of the plurality of pixel zones is provided with one of the plurality of first color micro LEDs, one of the plurality of second color micro LEDs and one of the plurality of third color micro LEDs, and the shading layer overlaps part of the third light emitting surface in the display direction.

6. The display panel according to claim 5, wherein an area of the third light emitting surface exposed by the shading layer is the same as an area of the first light emitting surface exposed by the shading layer, or an area of the third light emitting surface exposed by the shading layer is the same as an area of the second light emitting surface exposed by the shading layer.

7. The display panel according to claim 5, wherein an area of the first light emitting surface exposed by the shading layer, an area of the second light emitting surface exposed by the shading layer and an area of the third light emitting surface exposed by the shading layer are the same.

8. The display panel according to claim 5, wherein an area of the first light emitting surface is larger than an area of the second light emitting surface, and the area of the second light emitting surface is larger than or equal than an area of the third light emitting surface.

9. The display panel according to claim 8, wherein a wavelength of the first color micro LEDs is greater than a wavelength of the second color micro LEDs, and the wavelength of the second color micro LEDs is greater than a wavelength of the third color micro LEDs.

10. The display panel according to claim 1, wherein an area of the first light emitting surface exposed by the shading layer is larger than an area of the second light emitting surface exposed by the shading layer.

11. The display panel according to claim 10, wherein a wavelength of the first color micro LEDs is greater than a wavelength of the second color micro LEDs.

12. The display panel according to claim 11, wherein an area of the first light emitting surface is the same as an area of the second light emitting surface.

13. The display panel according to claim 1, wherein the shading layer comprises a plurality of openings corresponding to the plurality of pixel zones, and each of the plurality of openings expose part of the first light emitting surface of each of the plurality of first color micro LEDs and the second light emitting surface of each of the plurality of second color micro LEDs.

14. The display panel according to claim 13, wherein the light emitting surface of each of the plurality of first color micro LEDs is the same as the light emitting surface of each of the plurality of second color micro LEDs, and a luminous efficiency of each of the plurality of first color micro LEDs is different from a luminous efficiency of each of the plurality of second color micro LEDs.

15. The display panel according to claim 14, wherein the luminous efficiency of each of the plurality of first color micro LEDs is greater than the luminous efficiency of each of the plurality of second color micro LEDs.

16. The display panel according to claim 13, wherein a light emitting area of each of the plurality of first color micro LEDs is different from a light emitting area of each of the plurality of second color micro LEDs.

17. The display panel according to claim 13, wherein a wavelength of the plurality of first color micro LEDs is greater than a wavelength of the plurality of second color micro LEDs, and an area of the first light emitting surface exposed by the shading layer is larger than an area of the second light emitting surface exposed by the shading layer.

18. The display panel according to claim 1, wherein a maximum width of the first light emitting surface exposed by the shading layer and a maximum width of the second light emitting surface exposed by the shading layer are respectively less than 50 micrometers.

19. The display panel according to claim 1, wherein a ratio of the shading layer in each of the plurality of pixel zones is larger than the first light emitting surface, the second light emitting surface or the third light emitting surface in each of the plurality of pixel zones.

20. The display panel according to claim 1, wherein a ratio of the shading layer in each of the plurality of pixel zones is larger than the sum of the first light emitting surface, the second light emitting surface and the third light emitting surface in each of the plurality of pixel zones.

21. The display panel according to claim 1, wherein a ratio of the shading layer in each of the plurality of pixel zones is greater than or equal to 50%.

22. The display panel according to claim 1, wherein an arrangement direction of the plurality of first color micro LEDs is different from an arrangement direction of the plurality of second color micro LEDs.

23. The display panel according to claim 1, wherein two adjacent pixel zones of the plurality of pixel zones share one of the plurality of first color micro LEDs.

24. The display panel according to claim 1, wherein a distance between two adjacent first color micro LEDs is less than a distance between two adjacent second color micro LEDs.

* * * * *